United States Patent
Schuster et al.

(10) Patent No.: US 12,354,757 B2
(45) Date of Patent: Jul. 8, 2025

(54) COMPOSITE NUCLEAR COMPONENT, DLI-MOCVD METHOD FOR PRODUCING SAME, AND USES FOR CONTROLLING OXIDATION/HYDRIDATION

(71) Applicant: COMMISSARIAT A L'ENERGIE ATOMIQUE ET AUX ENERGIES ALTERNATIVES, Paris (FR)

(72) Inventors: Frédéric Schuster, St Germain-en-Laye (FR); Fernando Lomello, Gif-sur-Yvette (FR); Francis Maury, Labege (FR); Alexandre Michau, Toulouse (FR); Raphaël Boichot, Domene (FR); Michel Pons, La Tronche (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/327,413

(22) Filed: Jun. 1, 2023

(65) Prior Publication Data
US 2023/0307151 A1 Sep. 28, 2023

Related U.S. Application Data

(62) Division of application No. 16/337,680, filed as application No. PCT/FR2017/052659 on Sep. 28, 2017, now Pat. No. 11,715,572.

(30) Foreign Application Priority Data

Sep. 28, 2016 (FR) .................................. 1659280
Sep. 28, 2016 (FR) .................................. 1659281

(51) Int. Cl.
C23C 16/18 (2006.01)
B32B 5/28 (2006.01)
(Continued)

(52) U.S. Cl.
CPC ............... *G21C 21/02* (2013.01); *B32B 5/28* (2013.01); *B32B 15/04* (2013.01); *C23C 16/18* (2013.01);
(Continued)

(58) Field of Classification Search
CPC ..... C23C 16/56; C23C 16/448; C23C 16/118; C23C 16/30
See application file for complete search history.

(56) References Cited

U.S. PATENT DOCUMENTS 5,077,091 A  12/1991 Nowak
5,301,211 A * 4/1994 Bryan ..................... C23C 14/35
                                                    204/192.16
(Continued)

FOREIGN PATENT DOCUMENTS

EP  0387113 A1  9/1990
FR  2612946 A1  9/1988
(Continued)

OTHER PUBLICATIONS

Maury et al., "Multilayer chromium based coatings grown by atmospheric pressure direct liquid injection CVD", Surface & Coatings Technology, pp. 983-987, vol. 204 (Apr. 2009).
(Continued)

*Primary Examiner* — Kelly M Gambetta
(74) *Attorney, Agent, or Firm* — FISHERBROYLES, LLP; Roger L. Browdy

(57) ABSTRACT

Composite nuclear component comprising i) a support containing a substrate comprising a metallic material and a ceramic material (1), the substrate (1) being coated or not coated with an interposed layer (3) positioned between the substrate (1) and at least one protective layer (2) and ii) the protective layer (2) composed of a protective material comprising chromium; the process comprising a step a) of
(Continued)

vaporizing a mother solution followed by a step b) of depositing the protective layer (2) onto the support via a DLI-MOCVD deposition process. The composite nuclear component has improved resistance to oxidation and/or migration of undesired material. The invention also relates to the use of the composite nuclear component for combating oxidation and/or degradation of the ceramic material contained in the substrate.

19 Claims, 13 Drawing Sheets

(51) Int. Cl.
| | | |
|---|---|---|
| *B32B 15/04* | (2006.01) | |
| *C23C 16/30* | (2006.01) | |
| *C23C 16/448* | (2006.01) | |
| *C23C 16/56* | (2006.01) | |
| *G21C 3/07* | (2006.01) | |
| *G21C 3/20* | (2006.01) | |
| *G21C 21/02* | (2006.01) | |

(52) U.S. Cl.
CPC ............ *C23C 16/30* (2013.01); *C23C 16/448* (2013.01); *C23C 16/56* (2013.01); *G21C 3/07* (2013.01); *G21C 3/20* (2013.01)

(56) References Cited

U.S. PATENT DOCUMENTS

| | | | | |
|---|---|---|---|---|
| 5,302,422 | A | 4/1994 | Nowak | |
| 8,343,582 | B2 | 1/2013 | Maury et al. | |
| 8,431,190 | B2 | 4/2013 | Maury et al. | |
| 9,963,775 | B2 | 5/2018 | Le Flem et al. | |
| 10,811,146 | B2 | 10/2020 | Schuster | |
| 11,104,994 | B2 | 8/2021 | Schuster | |
| 2010/0047449 | A1* | 2/2010 | Maury ............... | C23C 16/32 427/249.1 |
| 2013/0344348 | A1* | 12/2013 | Koo ................. | B23K 35/365 376/416 |
| 2014/0153688 | A1* | 6/2014 | Zabiego ............ | G21C 3/07 376/409 |
| 2015/0348652 | A1* | 12/2015 | Mazzoccoli ....... | G21C 21/02 427/580 |
| 2017/0043555 | A1* | 2/2017 | Xu ................... | G21C 21/02 |
| 2017/0287578 | A1 | 10/2017 | Brachet et al. | |
| 2018/0294062 | A1 | 10/2018 | Wolfe | |
| 2019/0003048 | A1 | 1/2019 | Schuster et al. | |

FOREIGN PATENT DOCUMENTS

| | | | |
|---|---|---|---|
| FR | 2904006 | A1 | 1/2008 |
| FR | 2904007 | A1 | 1/2008 |
| FR | 2989923 | A1 | 11/2013 |
| FR | 2992331 | A1 | 12/2013 |
| FR | 3025929 | A1 | 3/2016 |
| FR | 3045673 | A1 | 6/2017 |
| WO | 2008009714 | A1 | 1/2008 |
| WO | 2008009715 | A1 | 1/2008 |
| WO | 2013017621 | A1 | 2/2013 |
| WO | 2018060641 | A1 | 4/2018 |
| WO | 2018060642 | A1 | 4/2018 |
| WO | 2018060643 | A1 | 4/2018 |
| WO | 2018060644 | A1 | 4/2018 |

OTHER PUBLICATIONS

Douard et al., "Nanocrystalline chromium-based coatings deposited by DLI-MOCVD under atmospheric pressure from Cr(CO)6", Surface & Coatings Technology, pp. 6267-6271, vol. 200 (Dec. 2005).

Anderbouhr et al.,"LPCVD and PACVD (Ti,Al )N films: morphology and mechanical properties", Surface & Coatings Technology, pp. 103-110, vol. 115 (Jan. 1999).

Ossola et al., "MOCVD Route to Chromium Carbonitride Thin Films Using Cr(NEt2)4 as Single-Source Precursor: Growth and Mechanism", Chemical Vapor Deposition, pp. 137-143, vol. 3, No. 3 (1997).

Zhang et al.,"Microstructure and corrosion behavior of TiC/Ti(CN)/TiN multilayer CVD coatings on high strength steels", Applied Surface Science, pp. 626-631, vol. 280 (May 2013).

Gross et al., "Formation Mechanism of TiN by Reaction of Tetrakis(dimethylamido)-Titanium with Plasma-Activated Nitrogen", Journal of the Electrochemical Society, pp. L79-L82 (1995).

Li et al., "Synthesis of Ti—Al—Si—N nanocomposite films using liquid injection PECVD from alkoxide precursors", Acta Materialia, pp. 2041-2048, (Feb. 2006).

Abisset et al., "Gas and plasma nitriding pretreatments of steel substrates before CVD growth of hard refractory coatings", Thin Solid Films, pp. 179-185 (1998).

\* cited by examiner

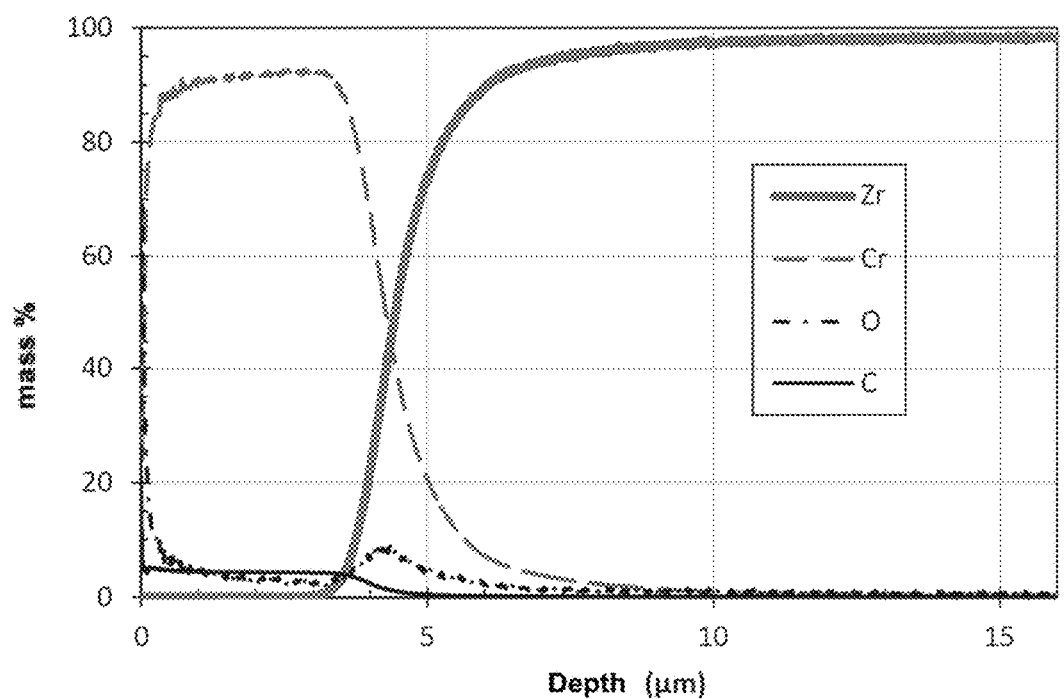
FIG. 1
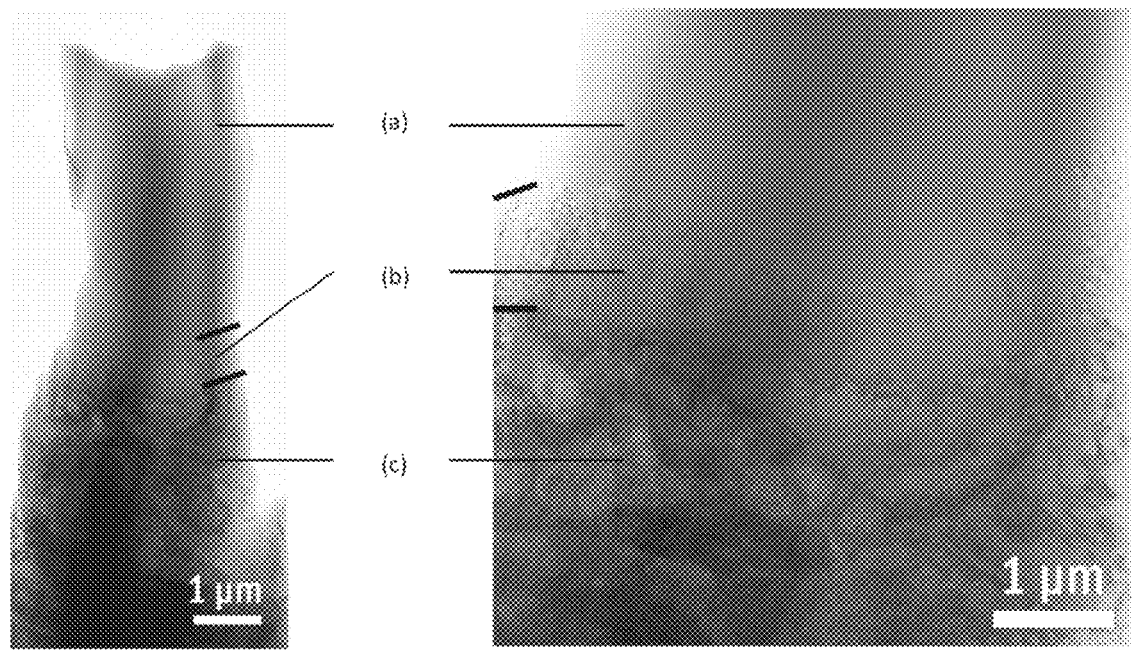
FIG. 2A                    FIG. 2B

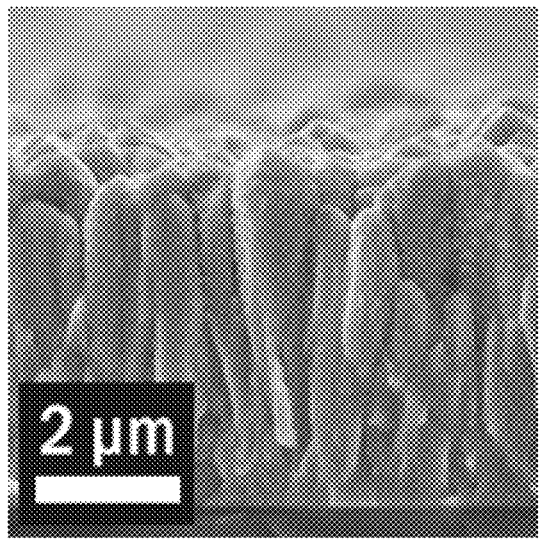 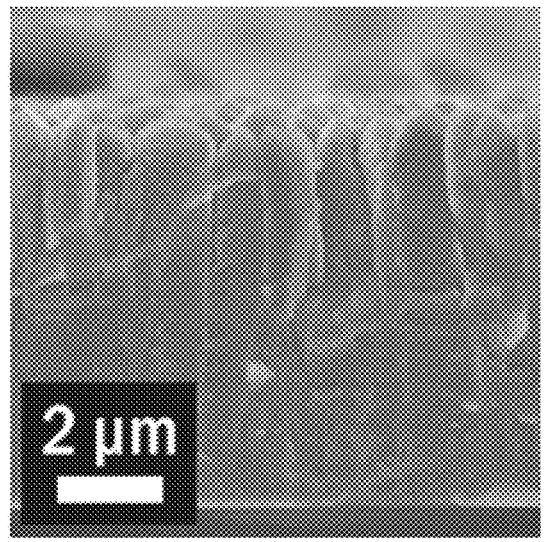
FIG. 8A					FIG. 8B
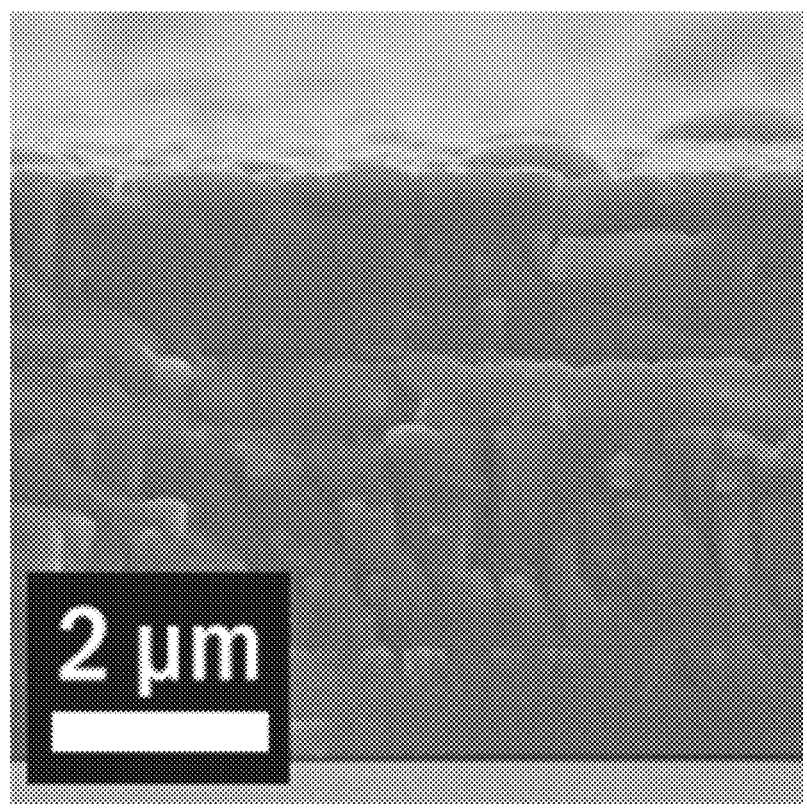
FIG. 8C

COMPOSITE NUCLEAR COMPONENT, DLI-MOCVD METHOD FOR PRODUCING SAME, AND USES FOR CONTROLLING OXIDATION/HYDRIDATION

TECHNICAL FIELD

The present invention relates to the field of materials used in the nuclear field, in particular materials intended to exhibit the best possible resistance to the physicochemical conditions encountered under nominal conditions and during a nuclear reactor accident, for instance in a pressurized water reactor (PWR) or a boiling water reactor (BWR).

The invention relates more particularly to a nuclear component, to the process for manufacturing same and to the uses thereof against oxidation and/or hydriding.

TECHNICAL BACKGROUND

The constituent zirconium alloy of current nuclear fuel claddings becomes oxidized on contact with water which constitutes the coolant for PWR or BWR nuclear reactors.

Since the oxide form is fragile and the uptake of hydrogen associated with oxidation leads to the precipitation of zirconium hydrides which are embrittling, the service life of the claddings is partly limited by the maximum acceptable thickness of oxide and the associated content of absorbed hydrogen. To ensure good residual mechanical properties of the cladding directed toward ensuring optimum confinement of the nuclear fuel, the residual thickness of healthy and ductile zirconium alloy must be sufficient and/or the fraction of hydrides must be sufficiently limited to ensure good residual mechanical properties of the cladding directed toward ensuring optimum confinement of the nuclear fuel.

The possibility of limiting or retarding such oxidation and/or hydriding may thus prove to be crucial under the conditions of an accident.

These conditions are reached, for example, in the case of hypothetical accident scenarios such as RIA ("Reactivity Insertion Accident") or LOCA ("Loss of Primary Coolant Accident"), or even under conditions of dewatering of the spent fuel storage pool. They are among others characterized by high temperatures which are generally greater than 700° C., in particular between 800° C. and 1200° C., and which may be reached with a high rate of temperature increase. At such temperatures, the coolant is in the form of steam.

Oxidation under the conditions of an accident is much more critical than under the conditions of normal nuclear reactor functioning, since the deterioration of the cladding, which is the first barrier for confinement of the fuel, is more rapid and the associated risks are greater. These risks are among others the following:
- emission of hydrogen;
- embrittlement of the cladding at high temperature by oxidation or even, under certain conditions, hydriding of the cladding;
- embrittlement of the cladding by quenching, caused by the abrupt decrease in temperature during the massive introduction of water for the securing of the nuclear reactor core;
- low mechanical strength of the cladding after quenching or cooling, in the case among others of handling operations after an accident, aftershocks of earthquakes, etc.

Given these risks, it is essential to limit as far as possible the oxidation and/or hydriding of the cladding at high temperature, or even at very high temperature, so as to improve the safety of nuclear reactors among others using water as coolant.

The very high temperatures are situated at the extreme limit or even beyond that of the high temperatures comprised between 700° C. and 1200° C. that are set by the accident regulatory conditions.

Now, the regulatory criteria governing the design-basis accidents according to the scenario of LOCA type defined in the 1970s stipulated that the maximum temperature of the cladding should not exceed 1204° C. (2200° F.) and stipulated a maximum degree of "ECR" oxidation of 17%.

The degree of "ECR" ("Equivalent Cladding Reacted") oxidation is the percentage of thickness of metal cladding transformed into zirconia ($ZrO_2$) resulting from the oxidation of the zirconium contained in the nuclear fuel cladding, assuming that all the oxygen that has reacted forms stoichiometric zirconia.

To take into account the additional embrittling effect associated with the hydriding of the cladding in service, this degree of acceptable residual "ECR" oxidation may now be substantially less than 17% under certain conditions, for instance a hydridized cladding in service of up to several hundred ppm by mass, which corresponds in practice to a degree of oxidation of the cladding which must not exceed a few minutes at 1200° C.

Improvement in the resistance to oxidation and/or hydriding at very high temperature would advantageously make it possible to obtain additional safety margins, among others by proportionately preventing or retarding the deterioration of the cladding in the event of worsening or persistence of the accident situation.

At least one of the abovementioned drawbacks may arise for other types of nuclear fuel claddings, among others of the composite cladding type as described in patent application WO 2013/017621 (reference [1]). A particular problem that further arises for such a composite cladding, in particular under nominal conditions of nuclear reactor functioning, is the risk of degradation of the inner tubular body or of the outer tubular body which are made of ceramic material. Such a ceramic material may, for example, disintegrate, among others following corrosion of the ceramic materials, for example at 360° C. for a pressurized water nuclear reactor (PWR).

DESCRIPTION OF THE INVENTION

One of the aims of the invention is thus to prevent or attenuate one or more of the drawbacks described above, by proposing a nuclear component and the process for manufacturing same which improves the resistance to oxidation, among others in the presence of water vapor.

Another aim of the invention may be to improve this resistance to oxidation at high temperature between 700° C. and 1200° C., or even at very high temperature above 1200° C.; among others when these temperatures are reached with a temperature increase rate which is comprised between 0.1° C./second and 300° C./second.

Another aim of the invention may be to improve the oxidation resistance time, beyond which time the integrity of the nuclear component, in particular the nuclear fuel confinement, is no longer ensured.

Another aim of the invention may be to improve the potential for industrialization of the manufacturing process, among others by proposing a process that is not only versatile but also economical and more environmentally friendly.

Another aim of the invention may be to prevent the degradation of the ceramic material of a cladding of composite type, in particular under nominal conditions of nuclear reactor functioning.

The present invention thus relates to a process for manufacturing a nuclear component via the method of chemical vapor deposition of an organometallic compound by direct liquid injection (DLI-MOCVD), the nuclear component comprising:
i) a support containing a substrate comprising a metallic material and a ceramic material, the substrate being coated or not with an interposed layer placed between the substrate and at least one protective layer;
ii) said at least one protective layer coating said support and composed of a protective material comprising chromium chosen from a partially metastable chromium comprising a stable chromium crystalline phase and a metastable chromium crystalline phase, an amorphous chromium carbide, a chromium alloy, a carbide of a chromium alloy, a chromium nitride, a chromium carbonitride, a mixed chromium silicon carbide, a mixed chromium silicon nitride, a mixed chromium silicon carbonitride, or mixtures thereof;
the process comprising the following successive steps:
a) vaporizing a mother solution containing a hydrocarbon-based solvent free of oxygen atoms, a precursor of bis(arene) type comprising chromium; and containing, where appropriate, an additional precursor, a carbon incorporation inhibitor or a mixture thereof; the precursors having a decomposition temperature comprised between 300° C. and 600° C.;
b) in a chemical vapor deposition reactor in which is located said support to be covered and the atmosphere of which is at a deposition temperature comprised between 300° C. and 600° C. and at a deposition pressure comprised between 13 Pa and 7000 Pa (or even from 130 Pa to 4000 Pa); introducing the mother solution vaporized in step a) and then depositing said at least one protective layer onto said support, this deposition being brought about by this introduction of the mother solution vaporized in step a).

In comparison with the processes of the prior art, the manufacturing process of the invention among others improves the resistance of a nuclear component with respect to oxidation, while at the same time offering a deposition process with great potential for industrialization enhanced by the possibility of recycling.

The manufacturing process of the invention uses a method of chemical vapor deposition of an organometallic compound by direct liquid injection (known as DLI-MOCVD, according to the English acronym for "Direct Liquid Injection—Metal Organic Chemical Vapor Deposition"). This method is described, for example, in the following documents: "F. Maury, A. Douard, S. Delclos, D. Samelor, C. Tendero; *Multilayer chromium based coatings grown by atmospheric pressure direct liquid injection CVD, Surface and Coatings Technology*, 204 (2009) 983-987" (reference [2]), "A. Douard, F. Maury; *Nanocrystalline chromium-based coatings deposited by DLI-MOCVD under atmospheric pressure from Cr (CO) 6, Surface and Coatings Technology*, 200 (2006) 6267-6271" (reference [3]), WO 2008/009714 (reference [4]) and WO 2008/009715 (reference [5]).

As a reminder, the principle of the DLI-MOCVD technique is to directly introduce, into a chemical vapor deposition chamber, under continuous or pulsed conditions, a precursor of the metal to be deposited in vaporized form.

With this aim, starting with a feed tank under pressure (for example at a pressure of $3\times10^5$ Pa of an inert gas), a mother solution containing at least one organometallic compound as precursor is introduced into an evaporator. It is then split up into microdroplets to form an aerosol which is flash-vaporized. Flash evaporation consists in rapidly vaporizing a compound outside the pressure and temperature conditions predicted by its saturated vapor pressure law. The evaporator is heated to a temperature such that the precursor and its solvent are vaporized, without, however, bringing about decomposition at this stage. The temperature is conveniently comprised between the boiling point of the solvent and the decomposition temperature of the precursor and, incidentally, that of the solvent, for example 200° C.

The parameters for injection of the mother solution are preferably set using a computer program. They are adjusted so as to obtain a mist of very fine and numerous droplets, in order to obtain satisfactory flash evaporation under reduced pressure. The liquid injection thus constitutes a well-controlled source of organometallic precursor, which does not limit the possibilities for optimization of the parameters of the coating deposition process.

This flexibility in the formulation of the mother solution makes it possible to deposit a wide variety of coatings with a single physical vapor deposition device. The composition, structure, geometry and physicochemical characteristics of a coating may in particular be broken down into numerous variants, among others for a coating such as a protective layer, an interposed layer or a liner.

The vaporized mother solution is entrained by a stream of inert gas from the evaporator to the deposition zone of the reactor in which the substrate to be covered was placed. The carrier gas used is preferably preheated to the temperature of the evaporator to obtain more efficient vaporization. Said gas is inert so as not to react with the reagents present, for example by oxidizing them. Nitrogen is generally chosen for its low cost, but helium, which benefits from better thermal conductivity, or argon, which has greater protective power, may also be employed.

According to the manufacturing process of the invention, the chemical vapor deposition reactor chamber is heated to a deposition temperature comprised between 300° C. and 600° C. For this temperature range, the organometallic precursor, in particular of bis(arene)metal type, decomposes without degrading the solvent, so as to prevent as much as possible the production of reaction byproducts that are liable to pollute the chamber by becoming deposited on the reactor walls or even on the substrate. If the substrate to be covered is metallic, the temperature may be limited to the resistance temperature of the metal so as to prevent it from undergoing any deformation or phase transformation. The reduced deposition temperature for the DLI-MOCVD process is an advantage when compared with other vapor chromization CVD processes which use gaseous transition metal halides and operate at temperatures which may reach 900° C.

The chemical vapor deposition reactor is placed under reduced pressure, at which the main steps of the deposition are performed, from the vaporization of the mother solution up to the optional collection of the effluent obtained on conclusion of the manufacturing process. The reduced pressure is generally from a few Torr to a few tens of Torr. They are thus moderately reduced pressures with regard to the pressures from about 10-3 Torr to 10-4 Torr of industrial PVD processes which require high vacuum equipment.

One of the advantages of the DLI-MOCVD deposition process for coating a nuclear component with a protective layer is that said layer can be deposited on the inner surface and/or the outer surface of the substrate coated or not with an interposed layer.

Protection of the inner layer of a nuclear component via the manufacturing process of the invention is particularly advantageous when the substrate to be coated is of large size, for example in the case of a nuclear fuel tubular cladding 1 cm in diameter and about 4 m long. It partly solves the oxidation problems encountered in the nuclear sector.

Specifically, by way of example, during a loss of primary coolant accident (LOCA) scenario in second and third generation reactors, a zirconium alloy fuel cladding is subjected to a sudden rise in internal temperature and pressure, which lead to ballooning and to accelerated oxidation of the cladding. The combination of these two phenomena may lead to bursting of the cladding, and thus to rupture of the nuclear fuel confinement and of the fission products it contains.

The inner surface of the cladding thus exposed is particularly sensitive to oxidation and to secondary hydriding, namely massive localized hydriding which results from the depletion in oxygen of the water vapor atmosphere via the confinement effect. The cladding may then become degraded by cracking during the quenching caused by the rewatering of the accident-hit core, or even during post-quenching mechanical stresses (earthquake aftershocks, handling, etc.). This degradation may possibly lead to a loss of efficiency of cooling of the fuel assemblies and progress toward an uncontrolled degraded situation ("serious accidents").

Coating of the inner surface of a nuclear fuel cladding with at least one protective layer aids in limiting, retarding or even preventing internal oxidation and/or secondary hydriding under LOCA conditions.

It is also advantageous for combating secondary hydriding under nominal conditions in the event of incidental piercing of the cladding and for combating the problem of the fuel pellet-cladding interaction.

Moreover, the nuclear component of the invention prevents or attenuates the degradation of the ceramic material contained in the substrate or even of the substrate as a whole, in particular under nominal conditions of nuclear reactor functioning.

The substrate onto which is deposited at least one protective layer via the manufacturing process of the invention comprises a metallic material and a ceramic material. Without necessarily being of tubular shape, the substrate of the invention may more particularly correspond to the composite multilayer part as described in patent application WO 2013/017621 (reference [1]) which is incorporated by reference into the present description.

According to a preferred embodiment of the invention, the substrate comprises a metal body sandwiched between an outer body made of ceramic-matrix composite material and, among others when the nuclear component comprises an inner volume which may or may not be open, an inner body made of ceramic-matrix composite material, the outer body and the inner body covering, respectively, the outer surface and the inner surface of the metal body.

Under the conditions of an accident (pressure differential between the inner surface and the outer surface of the substrate), a mechanical constraint which may result in multiple cracking of the outer body and/or of the inner body made of composite materials may take place. As a result of the cracking of these two bodies, the leaktightness, for example with respect to the nuclear fuel and the fission gases contained in a nuclear fuel cladding, is no longer ensured by said bodies but by the central metal body. Although cracked, the outer body and/or the inner body nevertheless participate in preserving the mechanical integrity and the hermetic nature of the central metal body.

The metal body may have a mean thickness:
less than the mean thickness of the outer body or less than that of the inner body;
comprised between 5% and 20% of the mean thickness of the substrate; and/or
comprised between 50 µm and 200 µm.

Preferentially, the metal body is composed of a metallic material chosen from niobium, tantalum, tungsten, titanium, or base alloys thereof.

By way of example, the niobium-based alloy is Nb-1Zr or Nb-1Zr-0.1C; the tungsten-based alloy is W-5Re.

Still preferentially, the outer body and the inner body each comprise an identical or different ceramic-matrix composite material, chosen from Cf/C, Cf/SiC or SiCf/SiC.

A ceramic-matrix composite (CMC) material, for example of $SiC_f/SiC$ type, is generally made of a two-dimensional or three-dimensional arrangement of silicon carbide fibers (denoted $SiC_f$) which reinforce the SiC ceramic matrix into which it is incorporated. Optionally, an interphase material may be placed between the matrix and the fibers. It is made, for example, of pyrocarbon According to a particular geometry, the nuclear component manufactured via the process of the invention may comprise an interposed layer positioned between the substrate and at least one protective layer.

In this embodiment, the support is formed by the combination of the substrate and of the interposed layer.

The interposed layer may serve as a diffusion barrier.

The interposed layer may be deposited onto the substrate via a wide variety of deposition methods, more particularly by performing a DLI-MOCVD deposition or by plasma-enhanced chemical vapor deposition (CVD), onto the outer surface of the substrate and/or onto its inner surface.

These two methods may be used when the interposed layer is deposited onto the outer surface of the substrate.

On the other hand, only deposition by DLI-MOCVD makes it possible to cover the inner surface of the substrate, generally when the interposed layer is composed of a metallic material. The operating conditions for deposition by DLI-MOCVD are then those described elsewhere in the present description. In particular, the precursor comprising an interposed material chosen from chromium, tantalum, molybdenum, tungsten, niobium or vanadium may be of the bis(arene) type according to the variants indicated in the present description.

The plasma-enhanced CVD deposition method is, for its part, only used for deposition onto the outer surface of the substrate, generally when the interposed layer is composed of a ceramic material. Preferentially, the interposed layer is then deposited onto the outer surface of the substrate by performing the plasma-enhanced CVD deposition using a mixture comprising at least one titanium, aluminum or silicon halide and a gaseous nitrogen precursor, as illustrated, for example, by the document "S. Anderbouhr, V. Ghetta, E. Blanquet, C. Chabrol, F. Schuster, C. Bernard, R. Madar; *LPCVD and PACVD (Ti,Al)N films: morphology and mechanical properties; Surface and Coatings Technology*, Volume 115, Issues 2-3, Jul. 18, 1999, pages 103-110" (reference [6]).

Preferentially, the titanium, aluminum or silicon halide is a titanium, aluminum or silicon chloride. It is chosen, for example, from $TiCl_4$, $AlCl_3$ and $SiCl_4$ or mixtures thereof.

Preferentially, the interposed layer may comprise at least one interposed material chosen from chromium, tantalum, molybdenum, tungsten, niobium, vanadium, alloys thereof, a titanium nitride, a titanium carbonitride, a mixed titanium silicon nitride, a mixed titanium silicon carbide, a mixed titanium silicon carbonitride, a mixed titanium aluminum nitride, or mixtures thereof.

The interposed material composed of a titanium nitride, a titanium carbonitride, a mixed titanium silicon nitride, a mixed titanium silicon carbide, a mixed titanium silicon carbonitride or a mixed titanium aluminum nitride is a ceramic interposed material: each of these materials is generally denoted, respectively, as TiN, TiCN, TiSiN, TiSiC, TiSiCN or TiAlN, without this implying any stoichiometry; the nitrogen, carbon, silicon and aluminum atoms generally being insertions into the titanium metal matrix.

Preferentially, the thickness of the interposed layer is from 1 μm to 5 μm.

The interposed layer may comprise an outer interposed layer and/or, among others when the nuclear component comprises an inner volume which may or may not be open, an inner interposed layer covering, respectively, the inner surface of said at least one protective layer and the outer surface of the substrate.

A nuclear component which comprises an inner volume is, for example, a nuclear fuel cladding, a guide tube, a plate fuel (the inner volume of which is not open, it nevertheless being possible for this component to be manufactured by assembling several parts that may comprise a surface onto which the inner protective layer is deposited, these surfaces forming—after assembly of the parts—the inner surface of the support covered with the protective layer), or an absorber rod.

The outer or outer interposed layer reinforces the adhesion with the layer with which it is in contact and/or the diffusion-barrier property of this adjacent layer.

According to another particular geometry, the nuclear component manufactured via the process of the invention may further comprise a liner placed on the inner surface of the support. This liner generally acts as a diffusion barrier or improves the robustness of the nuclear component with respect to possible chemical or mechanical interactions.

According to a particular embodiment, the liner may comprise an upper liner covering the inner surface of the support and/or a lower liner covering the upper liner.

The upper or lower liner reinforces the adhesion with the layer with which it is in contact and/or the diffusion-barrier property of this adjacent layer.

Said at least one protective layer may be an outer protective layer which coats the outer surface of said support and/or, among others when the nuclear component comprises an inner volume which may or may not be open, an inner protective layer which coats the inner surface of said support coated or not coated with the liner.

The liner does not necessarily constitute a coating: it may be a part that is assembled or fitted subsequently into the nuclear component. It may also be obtained by hot coextrusion during the manufacture of the substrate.

Alternatively, the liner may be deposited, at a deposition temperature comprised between 200° C. and 400° C., onto the inner surface of the support by chemical vapor deposition of an organometallic compound (MOCVD) or DLI-MOCVD with, as precursor(s), a titanium amide and further a precursor comprising silicon, a precursor comprising aluminum and/or a liquid additive comprising nitrogen as precursor if the material of which the liner is composed comprises, respectively, silicon, aluminum and/or nitrogen.

The MOCVD deposition method is described, for example, for the titanium homolog which may be chromium for this MOCVD process in the document "F. Ossola, F. Maury: *MOCVD route to chromium carbonitride thin films using Cr (NEt2) 4 as single-source precursor: growth and mechanism.*, Adv. Mater. Chem. Vap. Deposition, 3 (1997) 137-143." (reference [7]).

Preferentially, during the deposition of the liner by MOCVD or DLI-MOCVD, the liquid additive comprising nitrogen is ammonia, or optionally a molecular precursor comprising a titanium-nitrogen bond. A high concentration of the liquid additive comprising nitrogen generally promotes the formation of a nitride at the expense of a carbide, the carbon of which comes from the organometallic precursors.

The MOCVD or DLI-MOCVD deposition temperature may be comprised between 300° C. and 400° C. so as to promote as best as possible the proportion of the amorphous structure in the material of which the liner is composed and thus the performance of the liner as a diffusion barrier.

Alternatively, the MOCVD or DLI-MOCVD deposition temperature may be between 400° C. and 550° C., or between 400° C. and 500° C., or between 400° C. and 450° C., so as to increase the deposition rate.

Preferentially, the material of which the liner is composed comprises titanium nitride, a titanium carbonitride, a mixed titanium silicon nitride, a mixed titanium silicon carbide, a mixed titanium silicon carbonitride, a mixed titanium aluminum nitride, or mixtures thereof.

The liner generally has a thickness of from 1 μm to 10 μm.

Other deposition methods may also be suitable for depositing the liner, for instance CVD, plasma CVD or DLICVD deposition, as illustrated, respectively, by the documents "Jin Zhang, Qi Xue and Songxia Li, *Microstructure and corrosion behavior of TiC/Ti (CN)/TiN multilayer CVD coatings on high strength steels.* Applied Surface Science, 2013. 280: pages 626-631" (reference [8]), "A. Weber, C.-P. Klages, M. E. Gross, R. M. Charatan and W. L. Brown, *Formation Mechanism of TiN by Reaction of Tetrakis(dimethylamido)-Titanium with Plasma-Activated Nitrogen.* Journal of The Electrochemical Society, 1995. 142(6): pages L79-L82." (reference [9]) or "Y. S. Li, S. Shimada, H. Kiyono and A. Hirose, *Synthesis of Ti—Al-Si-N nanocomposite films using liquid injection PECVD from alkoxide precursors.* Acta Materialia, 2006. 54 (8): pages 2041-2048" (reference [10]).

In order to deposit at least one protective layer onto the support or the substrate, the manufacturing process of the invention comprises two steps in its general embodiment:
   a step a) of vaporization of the mother solution comprising the precursor(s) of the protective layer,
   a step b) of deposition of the vaporized mother solution, during which the protective layer is formed on the substrate.

Step a) of the vaporization of the mother solution is preferentially performed at a vaporization temperature comprised between 120° C. and 220° C.

The mother solution contains a solvent, a precursor of bis(arene) type comprising chromium; where appropriate, an additional precursor and a carbon incorporation inhibitor.

The choice of the solvent contained in the mother solution generally satisfies several criteria.

First, the boiling point of the solvent is less than the temperature of the evaporator in order to make possible flash evaporation in the evaporator. It does not contain any oxygen, to prevent the oxidation of the deposits by cracking. It is chemically inert with respect to the precursor in solution and is liquid under standard temperature and pressure conditions, namely, according to the present description, atmospheric pressure and a temperature of 25° C. Finally, the solvent does not decompose significantly in the reactor, so as to be recovered in the effluent leaving the reactor and to avoid or limit any pollution.

For these reasons among others, the solvent of the mother solution is a hydrocarbon-based solvent, i.e. it is composed solely of carbon and hydrogen.

Preferably, the solvent belongs to a chemical family similar to that of the ligands of at least one precursor compound, for example the precursor of bis(arene) type comprising chromium belonging to the aromatic hydrocarbon (or arene) family. This is because, during the passage through the reactor, this precursor decomposes thermally, releasing its ligands one after the other. The reaction byproducts are thus essentially free arenes, which mix all the better with the solvent when they are chemically similar or even identical to it. As a result, the compounds collected in the effluent leaving the reactor (precursor or unconsumed reagent, byproducts of the DLI MOCVD reaction and solvent) are generally all aromatic hydrocarbons.

Preferentially, the solvent is thus a monocyclic aromatic hydrocarbon, which is liquid under standard conditions, with a boiling point below 150° C. and a decomposition temperature of greater than 600° C. Even more preferentially, it is chosen from benzene, or a benzene substituted with one or more identical or different groups chosen independently from methyl, ethyl and isopropyl groups. Even more preferentially, the solvent is toluene, mesitylene (1,3,5-trimethylbenzene) or ethylbenzene. It is also possible to use a mixture of these compounds as solvent.

One of the main constituents of the mother solution is a precursor of bis(arene) type comprising chromium, and, where appropriate, an additional precursor.

Depending on the composition chosen for the mother solution, various protective materials described below may be deposited by decomposition of the precursors during the deposition step b). Since all the protective materials contain chromium, the mother solution contains at least the solvent and the precursor of bis(arene) type comprising chromium, the concentration of which may be chosen within a wide range. This concentration has an influence mainly on the deposition rate according to step b): the more the mother solution is concentrated in precursor, the higher the growth rate of the coating.

The concentration in the mother solution of the precursor of bis(arene) type comprising chromium may be comprised between 0.1 mol·L$^{-1}$ and 4.4 mol·L$^{-1}$ (concentration of the pure precursor), generally between 0.1 mol·L$^{-1}$ and 1 mol·L$^{-1}$, typically 0.35 mol·L$^{-1}$.

Besides the precursors of the protective layer and the solvent, the mother solution may also comprise a carbon incorporation inhibitor which prevents or limits the deposition of a protective material comprising carbon: such a material may be a carbide, a mixed carbide, a carbonitride or a mixed carbonitride, these materials possibly comprising, for example, as atomic percentages, 35% of carbon and optionally 2% to 3% of oxygen often localized on the surface of the protective layer.

A small amount of carbon may occasionally be deposited with the chromium during step b), without, however, forming a carbide, even in the presence of the inhibitor.

The inhibitor is a nucleophilic compound, generally a chlorine-based or sulfur-based additive, free of oxygen atoms. Its decomposition temperature is greater than 500° C., which prevents or limits the heterogeneous decomposition of the aromatic ligands of the precursor of bis(arene) type comprising chromium during which, by dissociation of the metal-ligand bonds of the precursor, some of the hydrocarbon ligands decompose under the catalytic effect of the substrate and supply their carbons so as to form ceramics of carbide type.

Preferentially, the inhibitor is a monocyclic aromatic hydrocarbon substituted with a thiol group or at least one chlorine, and even more preferentially the inhibitor is thiophenol ($C_6H_5SH$) or hexachlorobenzene ($C_6Cl_6$).

The inhibitor may be present in a concentration equal to 1% to 10% of the molar concentration of the chromium precursor in the mother solution, for example 2%.

Once the vaporization of the mother solution has been performed in step a), the deposition step b) may be performed in a hot-walled reactor conventionally used in this field and operating under reduced pressure. The reactor in its entirety is heated to the temperature required for the deposition, so that the walls, the reactive gas phase circulating in the reactor and the substrate to be covered are at the same temperature. This type of reactor is also known as an "isothermal" reactor (or "quasi-isothermal" reactor, since a few temperature gradients may possibly remain).

Use may also be made of a cold-walled reactor, in which only the reactor is not at the deposition temperature but at a lower temperature. In this case, the reactor yield, determined from the consumption of precursor, is lower.

According to the invention, the chemical vapor deposition reactor is at a deposition temperature comprised between 300° C. and 600° C., so that any precursor of bis(arene) type present in the mother solution decomposes without, however, the solvent undergoing degradation. This avoids the generation of byproducts that are liable to pollute the chamber by becoming deposited on the reactor walls or even on the substrate.

The deposition temperature according to step b) is preferentially comprised between 350° C. and 550° C., even more preferentially between 350° C. and 450° C., so as to avoid or further limit any deformations or phase transformations of the substrate.

Alternatively, the deposition temperature according to step b) is comprised between 300° C. and 400° C., which improves the density of the protective layer and promotes its amorphous nature, and thus its resistance to oxidation and/or to the migration through the nuclear component of undesired material such as a fissile material.

The deposition step b) is performed on the final layer of the support. For example, for deposition onto the outer surface of the support, the deposition of the protective layer is performed on the substrate or on the final interposed layer depending on whether the support contains, respectively, a substrate that is bare or coated with at least one interposed layer.

After step b), the manufacturing process of the invention may comprise the following step:

c) performing on said at least one protective layer at least one step chosen from a subsequent treatment step of ionic or gaseous nitridation, ionic or gaseous silicidation, ionic or gaseous carbosilicidation, ionic or gaseous nitridation followed by ionic or gaseous silicidation or carbosilicidation.

This post-treatment step improves the heat resistance and the tribological properties of the protective layer, more particularly its scratch resistance.

These post-treatment methods are known to those skilled in the art, and are described, for example, in the document "S. Abisset, F. Maury, R. Feurer, M. Ducarroir, M. Nadal and M. Andrieux; *Gas and plasma nitriding pretreatment of steel* substrates before CVD growth of hard refractory coatings; Thin Solid Films, 315 (1998) 179-185" (reference [11]).

Since the ionic treatment is a plasma-enhanced treatment for which the minimum deposition temperature may be about 400° C., it is applicable only to the outer surface of a protective layer.

The minimum deposition temperature for a gaseous carbosilicidation and a gaseous silicidation is, respectively, about 900° C. and about 800° C.

In general, the silicidation and carbidation methods use, respectively, silane or one of its homologs ($Si_nH_{2n+2}$) and a hydrocarbon (for example $CH_4$, $C_3H_8$, $C_2H_2$ or $C_2H_4$) and may operate, respectively, with or without a plasma at a minimum temperature of about 800° C. or 400° C.

In general, steps a), b) and/or c) are performed with a carrier gas so as to inject any chemical species into the chemical vapor deposition reactor. The carrier gas comprises at least one rare gas, which is usually chemically inert with respect to the various chemical species present in the reactor. The rare gas may be chosen from xenon or krypton, but preferably from nitrogen, helium or argon. The carrier gas is, for example, at a pressure comprised between 0.2 Pa and 2 Pa.

Once the various steps of the manufacturing process of the invention have been performed, the gaseous effluent leaving the chemical vapor deposition reactor comprises precursor molecules, the solvent and, where appropriate, the inhibitor which have not been consumed or pyrolyzed. The effluent may also comprise free ligands dissociated from the precursor, which are of the same aromatic family as the solvent. They are incorporated into the base solvent, with which they are miscible, and act themselves as solvent. A major and unexpected advantage is that the majority of these compounds leaving the reactor at low temperature are monocyclic aromatic molecules, generally of chemical structure similar or identical to that of the initial compounds, namely the precursor or the solvent. It is thus advantageous to collect them. They are gaseous on leaving the reactor due to the temperature and pressure conditions, but liquid under standard conditions. The mixture thus collected will form a solution, known as daughter solution, which may be introduced into the feed tank of the reactor as a new mother solution that can be used in step a) of the manufacturing process of the invention. The recycling process resulting therefrom is described in patent application FR 1562862 (reference [12]).

By virtue of its features, the manufacturing process of the present invention allows such recycling and can thus function in a closed cycle, which has many advantages: reduction or even elimination of the discharging of environmentally unfriendly substances, economic saving via the optimum use of the precursors, and, as illustrated below, an increase in the hardness of the protective coating.

On conclusion of the manufacturing process of the invention, the support is coated with at least one protective layer. This protective coating makes it possible among others to combat the oxidation and/or migration of any undesired material inside or outside the nuclear component, for instance any fissile material derived from the nuclear fuel.

The protective materials that may be deposited via the manufacturing process of the invention are varied. They are described below.

According to one embodiment of the invention, the mother solution contains the inhibitor and the precursor of bis(arene) type comprising chromium; such that, at a deposition temperature comprised between 300° C. and 450° C., the protective material comprising a partially metastable chromium is obtained. In this case, the inhibitor is preferably a monocyclic aromatic hydrocarbon substituted with a thiol group, for instance thiophenol.

The protective layer comprising a partially metastable chromium generally has a columnar structure. The constituent columnar grains of the columnar structure may have a mean diameter of from 100 nm to 1 μm.

The metastable chromium crystalline phase generally comprises chromium of centered cubic crystallographic structure according to the Pm-3n space group. Preferentially, the stable chromium crystalline phase comprises chromium of centered cubic crystallographic structure according to the Im-3m space group and the metastable chromium crystalline phase comprises chromium of centered cubic crystallographic structure according to the Pm-3n space group. For example, the metastable crystalline phase comprising chromium of centered cubic crystallographic structure according to the Pm-3n space group represents from 1 atom % to 10 atom % of the partially metastable chromium.

The Im-3m and Pm-3n space groups are described, for example, on the following website: https://en.wikipedia.org/wiki/Space_group. Their structure and their proportion may be determined by X-ray diffraction (XRD).

Obtaining this Im-3m+Pm-3n partially metastable polycrystalline chromium is unexpected: to the inventors' knowledge, only the manufacturing process of the invention makes it possible to deposit a protective layer of such a crystallographic structure.

This crystallographic structure has a certain advantage for nuclear safety. Specifically, the metastable chromium crystalline phase of Pm-3n type disappears irreversibly above 450° C. Now, a nuclear reactor, for instance a PWR reactor, functions under nominal conditions at about 380° C. If an XRD analysis, for example during a non-destructive control (NDC), reveals a posteriori the disappearance of the chromium metastable phase of Pm-3n type in the partially metastable chromium protective layer, it may be deduced therefrom that the environment around the nuclear component obtained via the manufacturing process of the invention has been exposed, albeit briefly, to temperatures above 450° C., i.e. well above the nominal operating temperature of 380° C. Such a detection possibility, even a posteriori, of an abnormal increase in temperature constitutes a major advantage for managing the safety of a nuclear reactor. The protective layer comprising a partially metastable chromium thus acts as an internal probe of the nuclear component, without this, however, harming the overall behavior of the component in a nuclear environment.

According to another embodiment of the invention, the mother solution contains the precursor of bis(arene) type comprising chromium; such that, at a deposition temperature comprised between 300° C. and 500° C., the protective material comprising an amorphous chromium carbide is obtained.

In an ideal amorphous solid, of glass type, the atoms are arranged randomly forming a three-dimensional network. In the case of compounds of carbide or nitride type based on transition metals, a certain degree of short-range order may be demonstrated, for example over a distance of less than 10 nm. At this scale, the amorphous solid is of nanocrystalline nature: it is the disorientation of these domains relative to each other and the more disordered zones which separate them which gives them an amorphous structure.

Amorphous chromium carbide may be denoted as "a-$CrC_x$": the term "a-" means amorphous, and the coefficient x indicates that the carbide does not have exactly the stoichiometry of one of the three stable chromium carbide compounds ($Cr_{23}C_6$; $Cr_7C_3$; $Cr_3C_2$). Its composition may be close to $Cr_7C_3$ but intermediate with that of $Cr_3C_2$.

Above a deposition temperature of 500° C., chromium carbide is no longer amorphous but polycrystalline.

Obtaining a protective material comprising an amorphous chromium carbide via the manufacturing process of the invention may have numerous advantages.

As illustrated hereinbelow, amorphous chromium carbide is of very high hardness, for example between 22 GPa and 29 GPa, which is particularly high when the precursors are recycled on conclusion of the manufacturing process. It is moreover generally free of grain joints, which makes it an efficient diffusion barrier, even at high temperature. These structural characteristics of amorphous chromium carbide may be globally preserved even after oxidation at 1100° C. followed by quenching in water.

A protective layer composed of amorphous chromium carbide is thus an excellent solution for protecting a nuclear component with respect to oxidation, the migration of any undesired material, and/or damage during the handling of the nuclear component.

According to another embodiment of the invention, the mother solution contains the precursor of bis(arene) type comprising chromium, an additional precursor chosen from a precursor of bis(arene) type comprising vanadium, a precursor of bis(arene) type comprising niobium, a precursor comprising aluminum, or the mixture of these additional precursors; such that a protective material comprising a chromium alloy chosen from a chromium/vanadium alloy, a chromium/niobium alloy, a chromium/vanadium/niobium alloy or a chromium/aluminum alloy is obtained in the presence of the inhibitor or such that a protective material comprising a carbide of the chromium alloy chosen from a carbide of a chromium/vanadium alloy, a carbide of a chromium/niobium alloy, a carbide of a chromium/vanadium/niobium alloy or a carbide of the chromium/aluminum alloy is obtained in the absence of the inhibitor.

The carbide of the chromium alloy results from the incorporation of carbon into one of the abovementioned chromium alloys, forming an insertion carbide: it is thus a carbide of the chromium/vanadium alloy, a carbide of the chromium/niobium alloy, a carbide of the chromium/vanadium/niobium alloy or a carbide of the chromium/aluminum alloy (preferably the mixed carbide $Cr_2AlC$ of "MAX phase" type), which may be denoted, respectively, as CrVC, CrNbC, CrVNbC, CrAlC, without this notation referring to any stoichiometry.

Preferably, the chromium alloys or the corresponding carbide thereof are mixed alloys or mixed carbides (namely, they do not comprise any other metallic element in a significant content, for example a content of greater than 0.5 atom %) and/or they are chromium-based alloys or the corresponding carbide of the chromium-based alloy thereof.

These alloys improve the ductility of the protective layer of the nuclear component. The contents of each element in the alloy or in its mixed carbide are chosen by a person skilled in the art so as to obtain the mechanical properties, including the ductility, which are desired in a nuclear environment. For example, the atomic content of vanadium or niobium in these alloys may be comprised between 10% and 50%. In general, the mole ratios between the precursor of bis(arene) type comprising chromium and the precursor of bis(arene) type comprising vanadium or the precursor of bis(arene) type comprising niobium are similar or correspond, respectively, to the stoichiometric ratio in the chromium alloy between chromium and vanadium or niobium.

Preferentially, the chromium alloy is metastable or partially metastable, i.e. it is totally or partly formed from a metastable crystalline phase, which is promoted by reducing the deposition temperature.

According to another embodiment of the invention, the mother solution contains the precursor of bis(arene) type comprising chromium, a liquid precursor comprising nitrogen as additional precursor being present in the mother solution or a gaseous precursor comprising nitrogen being present in the chemical vapor deposition reactor; such that the protective material comprising a chromium nitride is obtained in the presence of the inhibitor or such that the protective material comprising a chromium carbonitride is obtained in the absence of the inhibitor.

In a nuclear fuel cladding, a protective material comprising a chromium nitride and/or a chromium carbonitride may further have the advantage of combating the interaction between the inner surface of the cladding (in particular of the substrate) and the nuclear fuel pellet, known as the pellet-cladding interaction. With this aim, the deposition of the protective layer may be completed by a passivation step directed toward partially oxidizing the protective layer, for example by placing it in contact with oxygen or water.

Preferentially, the deposition temperature according to step b) is comprised between 300° C. and 400° C., even more preferentially between 300° C. and 500° C., for example 480° C., such that the chromium nitride is amorphous.

Once all the inhibitor has been consumed to avoid the incorporation of carbon during the deposition of the chromium nitride, a chromium carbonitride may be formed with the remaining precursors. A mixture of nitride and carbonitride is then obtained.

Preferably, the chromium nitride or chromium carbonitride is CrN, $Cr_2N$ or $Cr_2(C,N)$.

The nature of the deposited nitride may depend on the ratio R between the partial pressure of the precursor comprising nitrogen and that of the precursor of bis(arene) type comprising chromium: for a given temperature, the hexagonal phase of the nitride $Cr_2N$ is preferentially obtained for low values of R and the cubic phase of the nitride CrN is obtained for the highest values. A person skilled in the art will also be able to vary the deposition temperature or the deposition pressure so as to promote the production of CrN or $Cr_2N$.

According to another embodiment of the invention, the mother solution contains the precursor of bis(arene) type comprising chromium, a precursor comprising silicon as additional precursor; such that, at a deposition temperature comprised between 450° C. and 500° C., the protective material comprising a mixed chromium silicon carbide is obtained.

Where appropriate, the protective material comprising a mixed chromium silicon carbide may be included in the composition of an interphase layer positioned between a layer of metallic nature and a layer of ceramic nature (for example of a composite material such as SiC/SiC) so as to promote the adhesion between these two layers of different nature.

Preferentially, the mixed chromium silicon carbide is amorphous, which may be promoted, for example, by an atomic percentage of silicon similar to chemical doping (for example an atomic percentage comprised between 1% and 3%) which retards the crystallization of the protective material and preserves the microstructure of the amorphous chromium carbide.

As illustrated hereinbelow, the amorphous mixed chromium silicon carbide has good durability.

Preferentially, the amorphous mixed chromium silicon carbide has the general formula $Cr_xSi_yC_z$, with the stoichiometric coefficients "x" comprised between 0.60 and 0.70, "y" comprised between 0.01 and 0.05, and "z" comprised between 0.25 and 0.35.

The mixed chromium silicon carbide may be of the "MAX phase" type.

The MAX phases herein are ternary carbides defined by the formula $M_{n+1}AX_n$, in which M is chromium, A is silicon and X is carbon. This class of materials is characterized by a hexagonal crystal structure containing a stack of nanometric layers, and a small proportion of nonmetallic atoms (25%, 33% and 37.5% when n is equal to 1, 2 and 3, respectively). These materials have both a metallic nature and properties similar to those of ceramics.

The mixed chromium silicon carbide of "MAX phase" type according to the invention preferably contains the silicon atom in an atomic percentage comprised between 15% and 30%. Preferentially, it is chosen from a mixed carbide of formula $Cr_2SiC$, $Cr_3SiC_2$, $Cr_5Si_3C_2$ or mixtures thereof, these carbides comprising, as atomic percentages, 25% of silicon, 17% of silicon, 30% of silicon and 25% of aluminum.

According to another embodiment of the invention, the mother solution contains the precursor of bis(arene) type comprising chromium, a precursor comprising silicon as additional precursor, a liquid precursor comprising nitrogen as additional precursor being present in the mother solution or a gaseous precursor comprising nitrogen being present in the chemical vapor deposition reactor; such that, at a deposition temperature comprised between 450° C. and 550° C., the protective material comprising a mixed chromium silicon nitride is obtained in the presence of the inhibitor or such that the protective material comprising a mixed chromium silicon carbonitride is obtained in the absence of the inhibitor.

Preferentially, the mixed chromium silicon carbonitride or the mixed chromium silicon nitride is amorphous, this structure being favored in particular by a moderate deposition temperature.

The mixed chromium silicon nitride may have the general formula $Cr_{x'}Si_{y'}N_{w'}$, with the stoichiometric coefficients "x'" comprised between 0.23 and 0.57, "y'" comprised between 0.003 and 0.240, and "w'" comprised between 0.42 and 0.56.

The mixed chromium silicon carbonitride may have the general formula $Cr_{x''}Si_{y''}C_{z''}N_{w''}$, with the stoichiometric coefficients "x''" comprised between 0.20 and 0.56, "y''" comprised between 0.005 and 0.220, "z''" comprised between 0.05 and 0.34 and "w''" comprised between 0.06 and 0.50.

To obtain the protective material comprising a mixed chromium silicon carbide, a mixed chromium silicon nitride or a mixed chromium silicon carbonitride, the molar percentage of the precursor comprising silicon may be from 10% to 90% in the mother solution, preferentially from 10% to 25%, for example 15%. The molar percentage is defined here as the ratio between the number of moles of the precursor comprising silicon/(the sum of the number of moles of the precursor comprising silicon and of the precursor of bis(arene) type comprising chromium). Whether it is gaseous or liquid, the precursor comprising nitrogen is generally present in excess amount in the chemical vapor deposition reactor. Its concentration is, for example, 100 to 200 times greater than that of the precursor of bis(arene) type comprising chromium.

According to another embodiment of the invention, the mother solution further contains, as additional precursors, at least one precursor of bis(arene) type comprising an addition element chosen from yttrium, aluminum, vanadium, niobium, molybdenum, tungsten, a precursor comprising aluminum or yttrium as addition elements or mixtures thereof; such that the protective material is doped with the addition element.

This doping may concern any protective material mentioned in the present description. When the protective material is doped with the addition element, it generally preserves the microstructure of the corresponding undoped protective material within which the addition element is usually in the form of an insertion element or even, in certain cases, in the form of a substitution element, for instance a substitution of chromium for silicon.

Preferentially, the protective material comprises the addition element in a content of from 1 atom % to 10 atom %. This content increases with the deposition temperature and the molar percentage in the mother solution of the precursor of bis(arene) type comprising an addition element which is generally greater than the atomic percentage of the addition element in the protective material.

The precursors intended to obtain each protective material described previously may have a variable composition.

Preferentially, the element M chosen from chromium, vanadium, niobium or the addition element which is present, respectively, in the precursor of bis(arene) type comprising chromium, the precursor of bis(arene) type comprising vanadium, the precursor of bis(arene) type comprising niobium or the precursor of bis(arene) type comprising the addition element. Each of these precursors of bis(arene) type thus comprises the corresponding element M. Preferably, the element M is in the oxidation state zero ($M_0$) so as to have a precursor of bis(arene) type comprising the element $M_0$.

Similarly, the element M chosen from chromium, tantalum, molybdenum, tungsten, niobium, or vanadium present in the precursor of bis(arene) type comprising an interposed material chosen from chromium, tantalum, molybdenum, tungsten, niobium, or vanadium is preferably in the oxidation state zero ($M_0$) so as to have a precursor of bis(arene) type comprising the element $M_0$.

In the precursor organometallic compound of bis(arene) type, the element $M_0$ is "sandwich" complexed by the organic ligands, namely the substituted or unsubstituted arene groups. Since the element $M_0$ has the same oxidation state as in the protective coating that is deposited (the mixed or non-mixed carbides, nitrides, carbonitrides generally being insertion compounds, the element $M_0$ preserves the oxidation state zero therein), the precursors of bis(arene) type usually decompose without a complex reaction, for instance a redox reaction generating numerous byproducts.

Preferentially, the precursor of bis(arene) type comprising the element $M_0$ is a precursor of bis(arene) type free of oxygen atoms, of general formula (Ar) (Ar') $M_0$ in which Ar and Ar', which may be identical or different, each represent, independently of each other, an aromatic group of benzene type or benzene type substituted with at least one alkyl group.

Since the stability of the metal-ligand bond increases substantially with the number of substituents on the benzene nucleus, it is advantageous to choose a precursor in which Ar and Ar' represent two sparingly substituted aromatic ligands. Preferentially, the aromatic groups Ar and Ar' then each represent a benzene ligand or a benzene ligand substituted with one to three identical or different groups chosen from a methyl, ethyl or isopropyl group.

The precursor of bis(arene) type comprising the element $M_0$ may thus be chosen from at least one compound of formula $M_0(C_6H_6)_2$, $M_0(C_6H_5Et)_2$, $M_0(C_6H_5Me)_2$ or $M_0(C_6H_5iPr)_2$. It then decomposes from about 300° C. If it has a decomposition temperature of greater than 600° C., it is generally not selected so as to avoid decomposition of the solvent and to limit the formation of byproducts.

Preferably, the precursor of bis(arene) type comprising the element $M_0$ has the formula $M_0(C_6H_5Et)_2$, since its liquid state under the conditions of the vaporization step a) significantly decreases the amount of solvent in the mother solution and thus to increase the deposition rate during step b).

By way of example, when the metal is chromium, the precursor may be a sandwich chromium compound, such as bis(benzene) chromium (known as BBC, of formula $Cr(C_6H_6)_2$), preferably bis(ethylbenzene)chromium (known as BEBC, of formula $Cr(C_6H_5Et)_2$), bis(methylbenzene) chromium (of formula $Cr(C_6H_5Me)_2$) and bis(cumene)chromium (of formula $Cr(C_6H_5iPr)_2$), or a mixture thereof. The precursor of bis(arene) type comprising the element $M_0$ may also be an asymmetric derivative of formula (Ar) (Ar')Cr, where Ar and Ar' are different; or a mixture of these bis(arene)chromium compounds which may be rich in one of these compounds. Only BBC exists in the form of a powder. It may be injected in the form of a solution, but the concentration is then rapidly limited by its low solubility in hydrocarbon-based solvents. The other precursors cited are liquid and may be injected directly without solvent, but this does not make it possible to satisfactorily control the microstructure of the deposits. Their use in solution is preferred, as this allows wide variation in the concentration of said solution, and better adjustment of the injection conditions and consequently of the physical properties.

Advantageously, the mother solution may contain various precursors, without having a negative impact on the manufacturing process of the invention. In particular, the exact nature of the aromatic ligands of the metal is not critical, provided that these ligands preferably belong to the same chemical family of sparingly substituted monocyclic aromatic compounds. The byproducts of the DLI-MOCVD reaction that are derived from the initial reagents may thus be reintroduced into the chemical vapor deposition reactor, even if the products collected at the reactor outlet have structural variations among themselves. The purity of the initial mother solution is not a critical point either, which makes it possible to use commercial solutions which may contain, for example, up to 10% of derived compounds. As it is possible to recycle these derived compounds in the process itself, the recycled mother solutions which will be used for a subsequent deposition will contain various bis (arene)s as precursors. The mother solution may thus contain a mixture of several different precursors of general formulae (Ar) (Ar') $M_0$. Such properties improve the capacities for industrialization of the manufacturing process of the invention.

As regards the precursors comprising a nitrogen atom, generally, the liquid precursor comprising nitrogen is hydrazine and/or the gaseous precursor comprising nitrogen is ammonia. In general, and unless otherwise indicated, the concentration in the chemical vapor deposition reactor of ammonia or hydrazine is, respectively, from 1 to 10 times or 1 to 500 times greater than the concentration of the precursor of bis(arene) type comprising chromium.

The precursor comprising silicon may, for its part, be an organosilane compound which preferably comprises a group of phenylsilane or alkylsilane type. Preferentially, the precursor comprising silicon is then chosen from diphenylsilane $(C_6H_5)_2SiH_2$, monophenylsilane $(C_6H_5)SiH_3$, diethylsilane $(C_2H_5)_2SiH_2$, triethylsilane $(C_2H_5)_3SiH$, or mixtures thereof.

The precursor comprising aluminum may be a tri(alkyl) aluminium of formula $AlR_3$, in which R is chosen, for example, from $CH_3$, $C_2H_5$ and $C(CH_3)_3$.

The precursor comprising yttrium may be an yttrium alkyl complex, particularly in which the alkyl group has large steric hindrance, more particularly a tri(alkyl)yttrium of formula $YR_3$. It may thus be tris(cyclopentadienyl)yttrium (denoted $YCp_3$) in which R=Cp=$C_5H_5$.

The precursor comprising yttrium may also be an yttrium amido complex, more particularly a tri(amido)yttrium of general formula $YL_3$. It may thus be tris[N,N-bis(trimethylsilyl)amide]yttrium.

In the light of the foregoing, the protective layer deposited onto the support, among others onto the substrate not coated with an interposed layer, thus has a wide variety of compositions.

The composition may also vary within a protective layer itself. Thus, a protective layer may have a composition gradient: when the protective material is composed of several chemical elements, for example elements A and B for a material of formula AxBy, a composition gradient consists in varying the atomic percentage x or y of at least one element A or B according to the thickness of the coating. This variation may be continuous or in stages.

In practice, to vary this atomic percentage, two mother solutions which are more or less rich in element A or B may be injected simultaneously at a variable flow rate during the growth of the protective layer using two injectors.

A protective layer with a composition gradient is particularly advantageous as interposed layer since it gradually accommodates the mechanical properties of the protective coating to be more coherent with the corresponding properties of the materials with which it forms a junction. The protective material deposited in a composition gradient is, for example, the alloy of chromium or its carbide, for example a chromium/vanadium alloy.

The protective coating comprising at least one protective layer may also have a variety of structures, of physicochemical characteristics and/or of geometries within one or more layers.

Thus, the protective layer may have a columnar or equiaxed structure. Preferably, the structure is equiaxed when the protective layer has a diffusion-barrier function. The diffusion-barrier property of a protective coating is influenced by its microstructure. Thus, usually, the anti-diffusion performance of an exogenous chemical element increases in the following order: columnar<equiaxed<amorphous.

In the columnar structure, the grains of the protective material are elongated, since they grow in a preferential direction perpendicular to the surface, generally after the protective layer reaches a critical thickness, for instance a few tens to hundreds of nanometers. The columnar structure is also favored by secondary growth by epitaxy, generally at high temperature and by making the stack grow very rapidly.

On the other hand, in the equiaxed structure, the grains of the protective material also grow in all their preferential growth directions.

The protective layer may also have a particular density. It is, for example, comprised between 90% and 100% (preferably 95% to 100%) of the density in solid form of the stable metallic chromium of centered cubic crystallographic structure according to the Im-3m space group.

Preferentially, said at least one protective layer has a hardness comprised between 15 GPa and 30 GPa, preferably between 20 GPa and 29 GPa. Generally, the denser a protective layer is, the more efficient it is as a diffusion barrier, for example for preventing the diffusion of oxygen, hydrogen or any undesired material. The density of a protective layer is generally higher when it forms part of a multilayer coating, or is formed at a reduced deposition rate, for example by working at reduced temperature or pressure.

The geometry of the protective coating comprising the protective layers may also be variable.

Each of said at least one protective layer may have a thickness of from 1 μm to 50 μm, even more preferentially from 1 μm to 25 μm, or even from 1 μm to 15 μm.

Alternatively, said at least one protective layer may have a thickness of from 10 μm to 50 μm: this protective layer of minimum thickness promotes the resistance to oxidation.

Preferentially, the cumulative thickness of said protective layers is from 2 μm to 50 μm. The nuclear component may comprise from 1 to 50 protective layers.

The protective coating may also be a monolayer or multilayer coating. Several identical or different protective layers of composition may form, respectively, a homogeneous multilayer protective coating or a heterogeneous multilayer protective coating.

Preferentially, the homogeneous multilayer protective coating generally disfavors the production of a columnar structure. It may comprise protective layers composed of the partially metastable chromium (its density promoting the diffusion-barrier role of the homogeneous multilayer coating) or of the chromium alloy, for example with a thickness of about 400 nm, or even from 100 nm to 400 nm.

A multilayer material differs from a monolayer material of overall equivalent chemical composition, among others by the presence of an interface between the layers. This interface is such that it generally corresponds to a perturbation of the microstructure at the atomic scale. It is identified, for example, by means of a fine characterization technique such as high-resolution transmission electron microscopy (TEM), EXAFS (Extended X-Ray Absorption Fine Structure) spectroscopy, a Castaing microprobe which gives a composition profile, or even a posteriori by the optional presence of oxide(s) since the interface zone is a preferential oxidation pathway.

A multilayer material is generally obtained via a process which performs a sequenced deposition of each monolayer. In order to deposit the homogeneous multilayer protective coating, the deposition of each layer may be separated by a waiting time, for example between 1 minute and 10 minutes, so as to purge the chemical vapor deposition reactor.

By way of example, when the protective coating is of the heterogeneous multilayer type, it may comprise protective layers composed of:
chromium and amorphous chromium carbide (denoted Cr/CrC), or
chromium and chromium nitride (denoted Cr/CrN), or
amorphous chromium carbide and chromium nitride (denoted CrC/CrN), or
chromium, amorphous chromium carbide and chromium nitride (denoted Cr/CrC/CrN), or chromium and mixed chromium silicon carbide (denoted Cr/Cr$_x$Si$_y$C$_z$), or
mixed chromium silicon carbide and amorphous chromium carbide (denoted Cr$_x$Si$_y$C$_z$/CrC), or
mixed chromium silicon carbide and chromium nitride (denoted Cr$_x$Si$_y$C$_z$/CrN), or
chromium and mixed chromium silicon nitride (denoted Cr/CrSixNy), or
mixed chromium silicon nitride and amorphous chromium carbide (denoted CrSixNy/CrC), or
mixed chromium silicon nitride and chromium nitride (denoted CrSixNy/CrN), or
mixed chromium silicon carbide and mixed chromium silicon nitride (denoted Cr$_x$Si$_y$C$_z$/CrSi$_x$N$_y$).

In order to manufacture a protective coating comprising several layers of different composition, one possibility is to use as many injectors as there are layers of different composition, each injector making it possible to introduce a mother solution of specific composition into the chemical vapor deposition reactor.

When the heterogeneous multilayer protective coating comprises a chromium protective layer, the last protective layer of the coating is generally a protective layer of ceramic nature (carbide, nitride or carbonitride, which may or may not be mixed).

The nuclear component is generally a component of the nuclear reactor core, more particularly a nuclear fuel cladding, a spacer grid, a guide tube, a plate fuel or an absorber rod. Preferentially, the nuclear fuel cladding is in the form of a tube or a plate. The plate may result more particularly from the assembly of two subunits.

The invention also relates to a nuclear component which is obtained or obtainable by the manufacturing process of the invention.

The invention also relates to a nuclear component comprising:
i) a support containing a substrate comprising a metallic material and a ceramic material, the substrate being coated or not coated with an interposed layer placed between the substrate and at least one protective layer;
ii) said at least one protective layer coating said support and composed of a protective material comprising chromium chosen from a partially metastable chromium comprising a stable chromium crystalline phase and a metastable chromium crystalline phase, an amorphous chromium carbide, a chromium alloy, a carbide of a chromium alloy, a chromium nitride, a chromium carbonitride, a mixed chromium silicon carbide, a mixed chromium silicon nitride, a mixed chromium silicon carbonitride, or mixtures thereof.

These two types of nuclear component, namely the nuclear component according to the invention and the nuclear component which is obtained or obtainable by the manufacturing process of the invention, may be in one or more of the variants described in the present description for the manufacturing process of the invention, among others the variants relating to the structure, the physicochemical characteristics (for instance the density), the geometry and/or the composition of the nuclear component.

These variants relate among others, but not exclusively, to: the substrate, the interposed layer, the liner, the protective layer including its combination with a particular substrate, the protective coating or the type of nuclear component as are detailed in the present description, among others the description of the manufacturing process of the invention.

For example, for these two types of nuclear component, the particular embodiments of the invention, optionally taken in combination, may be such that:
the substrate comprises a metal body sandwiched between an outer body made of ceramic-matrix composite material and, among others when the nuclear component comprises an inner volume which may or may not be open, an inner body made of ceramic-matrix composite material, the outer body and the inner body covering, respectively, the outer surface and the inner surface of the metal body;

the metal body has a mean thickness less than the mean thickness of the outer body or than that of the inner body;

the metal body has a mean thickness comprised between 5% and 20% of the mean thickness of the substrate;

the metal body has a mean thickness comprised between 50 μm and 200 μm;

the metal body is composed of a metallic material chosen from niobium, tantalum, tungsten, titanium, or base alloys thereof;

the outer body and the inner body each comprise an identical or different ceramic-matrix composite material, chosen from Cf/C, Cf/SiC or SiCf/SiC;

the interposed layer comprises an outer interposed layer and/or, among others when the nuclear component comprises an inner volume which may or may not be open, an inner interposed layer covering, respectively, the inner surface of the at least one protective layer and the outer surface of the substrate;

the interposed layer comprises at least one interposed material chosen from chromium, tantalum, molybdenum, tungsten, niobium, vanadium, alloys thereof, a titanium nitride, a titanium carbonitride, a mixed titanium silicon nitride, a mixed titanium silicon carbide, a mixed titanium silicon carbonitride, a mixed titanium aluminum nitride, or mixtures thereof;

the thickness of the interposed layer is from 1 μm to 5 μm;

the nuclear component further comprises a liner placed on the inner surface of the support;

the liner comprises an upper liner covering the inner surface of the support and/or a lower liner covering the upper liner;

the at least one protective layer is an outer protective layer which coats the outer surface of the support and/or, among others when the nuclear component comprises an inner volume which may or may not be open, an inner protective layer which coats the inner surface of the support coated or not coated with the liner;

the material of which the liner is composed comprises a titanium nitride, a titanium carbonitride, a mixed titanium silicon nitride, a mixed titanium silicon carbide, a mixed titanium silicon carbonitride, a mixed titanium aluminum nitride, or mixtures thereof;

the liner has a thickness of from 1 μm to 10 μm;

the chromium alloy is chosen from a chromium/vanadium alloy, a chromium/niobium alloy, a chromium/vanadium/niobium alloy or a chromium/aluminum alloy or the carbide of the chromium alloy is chosen from a carbide of a chromium/vanadium alloy, a carbide of a chromium/niobium alloy, a carbide of a chromium/vanadium/niobium alloy or a carbide of a chromium/aluminum alloy;

the mixed chromium silicon carbide is amorphous;

the mixed chromium silicon carbide is of the "MAX phase" type;

the mixed chromium silicon carbonitride or the mixed chromium silicon nitride is amorphous;

the protective material is doped with an addition element chosen from yttrium, aluminum, vanadium, niobium, molybdenum, tungsten, or mixtures thereof;

the protective material comprises the addition element in a content of from 1 atom % to 10 atom %;

the at least one protective layer has a composition gradient;

the at least one protective layer has an equiaxed structure;

the at least one protective layer has a density comprised between 90% and 100% of the density in solid form of the stable metallic chromium of centered cubic crystallographic structure according to the Im-3m space group;

the at least one protective layer has a hardness comprised between 15 GPa and 30 GPa;

each of the at least one protective layer has a thickness of from 1 μm to 50 μm, or even from 10 μm to 50 μm;

several protective layers of identical or different composition form, respectively, a homogeneous multilayer protective coating or a heterogeneous multilayer protective coating;

the homogeneous multilayer protective coating comprises protective layers composed of partially metastable chromium or of chromium alloy;

the heterogeneous multilayer protective coating comprises protective layers composed of:
chromium and amorphous chromium carbide, or
chromium and chromium nitride, or
amorphous chromium carbide and chromium nitride, or
chromium, amorphous chromium carbide and chromium nitride, or
mixed chromium silicon carbide and chromium, or
mixed chromium silicon carbide and amorphous chromium carbide, or
mixed chromium silicon carbide and chromium nitride, or
mixed chromium silicon nitride and chromium, or
mixed chromium silicon nitride and amorphous chromium carbide, or
mixed chromium silicon nitride and chromium nitride, or
mixed chromium silicon carbide and mixed chromium silicon nitride;

the nuclear component is a nuclear fuel cladding, a spacer grid, a guide tube, a plate fuel or an absorber rod.

The invention also relates to the use of these types of nuclear component for combating oxidation in a humid atmosphere comprising water, in particular in the form of water vapor.

The humid atmosphere may comprise from 25 mol % to 100 mol %, preferentially from 50 mol % to 100 mol % and even more preferentially from 75 mol % to 100 mol % of water vapor.

The humid atmosphere may further comprise an additional gas chosen from air, nitrogen, carbon dioxide, or mixtures thereof.

Preferentially, the purpose of these uses is to combat oxidation:
in which the humid atmosphere is at a temperature comprised between 25° C. and 1400° C., or even between 25° C. and 1600° C., more particularly a temperature comprised between 200° C. and 1300° C., even more particularly between 1200° C. and 1300° C., or even between 1300° C. and 1600° C.; or preferentially between 800° C. and 1200° C.; but also under nominal conditions of nuclear reactor functioning, for example at 380° C.; and/or
up to at least 5000 seconds, more particularly between 1000 seconds and 5000 seconds, in particular when the temperature is comprised between 1200° C. and 1300° C.; and/or
in the presence of a temperature increase rate which is comprised between 0.1° C./second and 300° C./second; and/or following quenching with water of the nuclear component, in particular in which the quenching takes place at a temperature comprised between 25° C. and 400° C.

The invention also relates to the use of the types of nuclear component as defined previously, for combating degradation of the ceramic material contained in the substrate, in particular for combating degradation under nominal conditions of nuclear reactor functioning, for example at 380° C.

The invention also relates to a probe for temperature variation (preferably a temperature increase above 450° C.) in a nuclear environment, the probe comprising a partially metastable chromium comprising a stable chromium crystalline phase and a metastable chromium crystalline phase.

As indicated previously, the use of partially metastable chromium for measuring a temperature variation among others has an advantage in the a posteriori measurement of a temperature increase above 450° C. and thus an advantage for nuclear safety.

The metastable chromium crystalline phase may comprise chromium of centered cubic crystallographic structure according to the Pm-3n space group.

Preferentially, the stable chromium crystalline phase comprises chromium of centered cubic crystallographic structure according to the Im-3m space group and the metastable chromium crystalline phase comprises chromium of centered cubic crystallographic structure according to the Pm-3n space group.

Generally, the metastable crystalline phase comprising chromium of centered cubic crystallographic structure according to the Pm-3n space group represents from 1 atom % to 10 atom % of the partially metastable chromium.

The probe may be the component of a system or of a part for non-destructive control (NDC), namely, for example, a control which characterizes the state of integrity of structures or materials, without degrading them, during their production, use or maintenance.

The part may thus be of very simple structure since it is essentially its composition which gives it its properties. It thus acts as a tracer and may be left in the nuclear environment in order to be able to be readily analyzed a posteriori for detecting the temperature variation.

For the sake of integration and compactness, the nuclear component of the invention may comprise the probe, among others in all the variants described for the nuclear component.

DETAILED DESCRIPTION OF THE INVENTION

In the present description of the invention, a verb such as "to comprise", "to incorporate", "to include", "to contain", "composed of" and the conjugated forms thereof are open terms and thus do not exclude the presence of additional element(s) and/or step(s) which are added to the initial element(s) and/or step(s) stated after these terms. However, these open terms further target a particular embodiment in which only the initial element(s) and/or step(s), with the exclusion of any other, are targeted; in which case, the open term further targets the closed term "to consist of", "to be constituted of" and the conjugated forms thereof.

The expression "and/or" is directed toward connecting elements for the purpose of simultaneously denoting a single one of these elements, both the elements, or even a mixture thereof or a combination thereof.

The use of the indefinite article "a" or "an" for an element or a step does not exclude, unless otherwise mentioned, the presence of a plurality of elements or steps.

Any reference sign in parentheses in the claims shall not be interpreted as limiting the scope of the invention.

Moreover, unless otherwise indicated, the limit values are included in the ranges of parameters indicated and the temperatures indicated are considered for an implementation at atmospheric pressure.

Any coating, layer or liner deposited by means of the manufacturing process of the invention can cover a part or, preferably, all of the surface on which it lies.

Still in the present description, any alloy is generally a base alloy. The term "base alloy" of the metal included among others in the composition of the substrate, of the protective material or of the interposed material denotes any alloy based on the metal in which the content of the metal is at least 50% by weight of the metal of the alloy, particularly more than 90%, or even more than 95%. The base metal is, for example, titanium, chromium, tantalum, molybdenum, tungsten, niobium or vanadium.

An alloy may also contain other chemical elements (for example in a content of greater than 0.5 atom %), in particular a second metal element, and then constitutes a mixed alloy.

The carbon insertion element and/or the nitrogen insertion element in an alloy form, respectively, a carbide of the alloy, a nitride of the alloy or a carbonitride of the alloy, which may also be mixed in the presence of a second metal element.

The alloy is preferably able to be used in the nuclear sector and/or under irradiation.

Other subjects, characteristics and advantages of the invention will now be specified in the description which follows of particular embodiments of the process of the invention, which are given by way of illustration and without limitation, with reference to the appended figures.

In the implementation examples that follow, the substrate described is not a substrate comprising a metallic material and a ceramic material in accordance with the invention. These examples nevertheless show by analogy the properties of the invention, in particular the properties of the coatings associated with the substrate of the invention.

BRIEF DESCRIPTION OF THE FIGURES

FIG. 1 represents the mass percentage of various chemical elements as a function of the depth obtained by Glow Discharge Spectrometry (GDS) of a Zircaloy-4 wafer covered with a layer of amorphous chromium carbide via the manufacturing process of the invention, after its exposure to ambient air.

FIGS. 2A (overall view) and 2B (magnification of the oxide substrate) are Transmission Electron Microscopy (TEM) images illustrating a cross section of the wafer whose GDS analysis is shown in FIG. 1.

FIGS. 8A, 8B and 8C represent SEM images illustrating the microstructure of a monolayer coating (8A, 8B) or multilayer coating (8C) of partially metastable chromium deposited at an increasing rate onto a silicon substrate.

DESCRIPTION OF SPECIFIC EMBODIMENTS

Figure 3A:
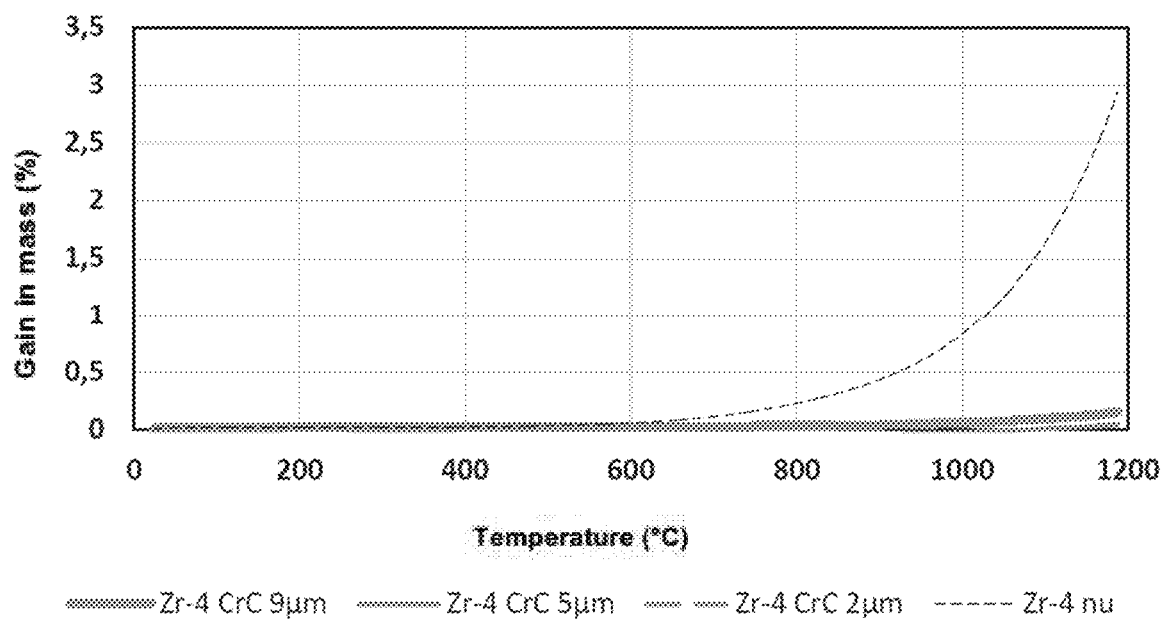
FIGS. 3A and 3B illustrate, respectively, after exposure to dry air and to humid air, the gain in mass as a function of the temperature for Zircaloy-4 wafers covered with various thicknesses of a protective layer of amorphous CrC and for a bare Zircaloy-4 wafer.
Figure 3B:
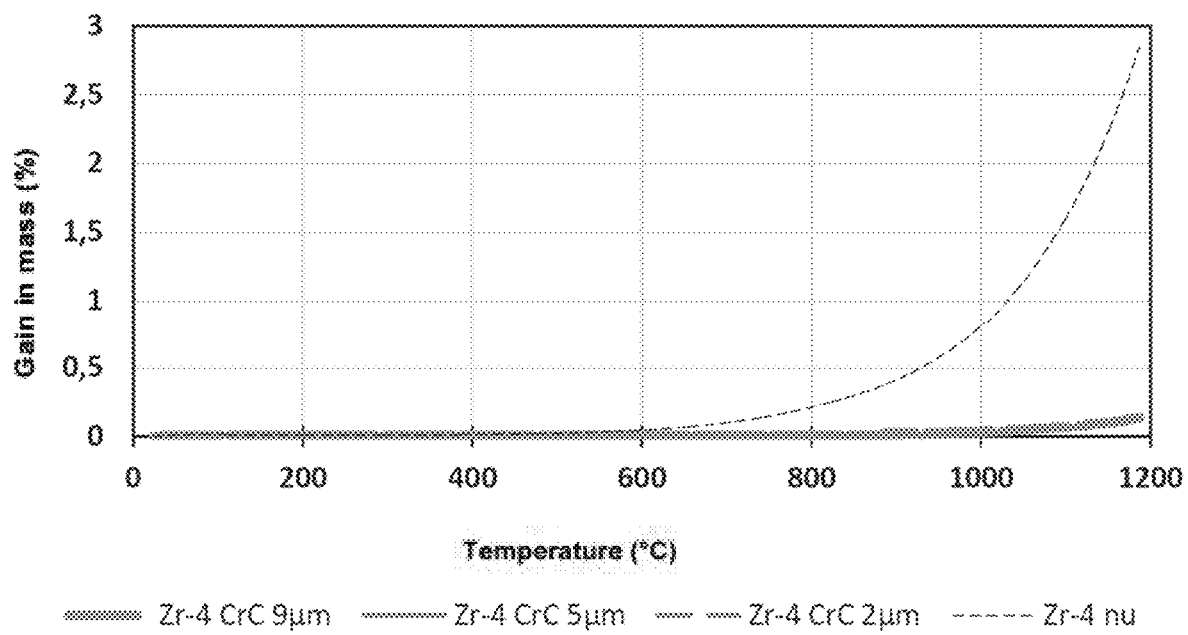

The examples of deposition of a coating onto a substrate which follow are performed in a chemical vapor deposition reactor placed in a tube furnace (model sold by the company Carbolite). The reactor is composed of a silica tube: it is connected to the gaseous effluent inlet and evacuation system via leaktight connections and to the mother solution via an injector (Vapbox model sold by the company Kemstream).

In the examples that follow, the substrate is not coated with an interposed layer. However, these examples may be transposed to the case where the substrate is formed from a substrate coated with an interposed layer.

1. Coating on a Silicon Substrate

As a preliminary experiment, the manufacturing process of the invention is transposed to a silicon substrate, a square silicon wafer (side length of 1 cm and 300 μm thick) is placed in the reactor so as to be covered with a protective layer of chromium carbide (CrC), chromium (Cr) or mixed chromium silicon carbide ($Cr_xSi_yC_z$ denoted CrSiC) using the following compounds:

chromium precursor: bis(ethylbenzene)chromium, known as BEBC (Cr $(C_6H_5Et)_2$), silicon precursor: bis(phenyl)silane ($H_2Si$ $(C_6H_5)_2$), inhibitor: thiophenol ($C_6H_5SH$), solvent: toluene, carrier gas: $N_2$ at a flow rate of 500 sccm, namely 500 cm$^3$/min under standard conditions, evaporator temperature: 200° C., deposition time: 20 minutes.

The other conditions for the deposition of the protective coating constituting the outer coating are indicated in Table 1, in particular the injector open time and frequency, and the temperature and pressure in the chemical vapor deposition reactor.

The injection parameters (open time and frequency) act essentially on the deposition rate and thus on the deposit thickness by varying the deposition time. The open frequency is, for example, from 1 Hz to 10 Hz, typically 10 Hz.

The parameters which act on the physicochemical and structural characteristics of the deposit are essentially the deposition temperature (acting in particular on the structure: amorphous or crystalline; dense or porous; equiaxed or columnar) and the composition of the injected solution.

By convention, the silicon substrate covered with coating number N is referred to in Table 1 as sample N: sample 1 thus denotes the silicon substrate covered with coating 1.

TABLE 1

| Coating (N) | Injected solution | Injection conditions | | Total deposition pressure ($10^{+3}$ Pa) | Deposition temperature (° C.) |
|---|---|---|---|---|---|
| | | Frequency (Hz) | Opening time (ms) | | |
| CrC (1) | BEBC (3.5 × 10$^{-1}$M) + toluene (50 ml) | 10 | 0.5-5 | 1.3; 6.7 | 450; 500; 550 |
| Cr (2) | BEBC (3.5 × 10$^{-1}$M) + thiophenol (2 mol %) + toluene (50 ml) | 10 | 0.5-5 | 6.7 | 400; 450 |
| CrSiC (3) | BEBC (3.5 × 10$^{-1}$M) + bis(phenyl)silane (15 mol %) + toluene (50 ml) | 4 | 0.5 | 6.7 | 450; 500 |

Table 2 collates the result of the structural analyses of these coatings, and also the result of the heat resistance tests detailed in the following examples (thermal stability: temperature at and above which a crystalline phase appears in XRD in situ under argon). The atomic composition expressed as atomic percentage is measured with a Castaing microprobe (known as EPMA, according to the English acronym for "Electron Probe Microanalysis"). Variation of the injection parameters gives several coating thicknesses, which are generally between 0.5 µm and 10 µm: the thicknesses selected for the oxidation tests that follow are indicated in Table 2.

As regards their structure, Table 2 shows that the CrC and CrSiC coatings are amorphous (no crystalline structure), the CrC coating nevertheless being polycrystalline for a deposition temperature of 550° C. As regards the Cr coating, it comprises two crystalline phases: a main phase composed of centered cubic (bcc) chromium crystals in the Im-3m space group (lattice parameter a=2.88 Å) and a phase in very minor proportion composed of chromium crystals of centered cubic crystallographic structure in the Pm-3n space group (lattice parameter a=4.59 Å) when the DLI-MOCVD deposition temperature is less than or equal to 450° C.

Alternatively, a bare silicon substrate may be passivated by thermal CVD with a mixture ($SiH_4+NH_3$) or by plasma (PECVD) with $NH_3$.

The passivated silicon substrate is then coated with amorphous chromium carbide according to the conditions of Table 1 (specific conditions: injection at 10 Hz, deposition temperature=500° C., deposition pressure=6700 Pa).

In a chamber flushed with a stream of argon to limit or even prevent any contamination with oxygen, this sample is heated from 30° C. to 800° C. at a temperature increase rate of 5° C./minute while in parallel being analyzed by X-ray diffraction (XRD). After natural cooling to 30° C., a final X-ray spectrum is recorded.

Analysis of the X-ray spectra obtained shows that the sample maintains an amorphous structure up to 570° C. It then crystallizes in the form of $Cr_7C_3$ at about 580° C., and then $Cr_3C_2$ at about 590° C., and finally becomes oxidized to $Cr_2O_3$ at about 610° C. due to traces of oxygen present on account of an airtightness defect of the reactor: these three phases remain up to 800° C. with a proportion of $Cr_2O_3$ which increases with the temperature.

TABLE 2

| Coating (N) | Thickness (µm) | Deposition temperature (° C.) | Structure | Atomic composition | Thermal stability (° C.) |
|---|---|---|---|---|---|
| CrC (1) | 2; 5; 9 | 400 | Amorphous | $Cr_{0.64}C_{0.33}O_{0.03}$ | $Cr_7C_3$ 580 |
|  |  | 500 |  |  | $Cr_3C_2$ 590 |
|  |  |  |  |  | $Cr_2O_3$ 610 |
|  |  | 550 | Polycrystalline | $Cr_{0.61}C_{0.32}O_{0.07}$ |  |
| Cr (2) | 4; 6 | 400 | Polycrystalline, | $Cr_{0.69}C_{0.12}S_{0.08}O_{0.11}$ | Metastable |
|  |  | 450 | two-phased: main phase Cr bcc (Im-3m); metastable phase Cr bcc (Pm-3n). Multilayer structure to increase the density. |  | Cr phase disappears at 450° C. |
| CrSiC (3) | 4 | 450 | Amorphous | $Cr_{0.66}Si_{0.02}C_{0.29}O_{0.03}$ | $Cr_7C_3$ 750 |
|  |  | 500 |  |  | $CrSi_2$ 750 |

2. Evaluation of the Heat Resistance

The coatings must withstand the temperature under an oxidative atmosphere and act as a diffusion barrier.

Their heat resistance under an inert atmosphere is first studied by XRD in situ as a function of the temperature under Ar. The temperature at which a structural change appears (crystallization, phase transformation) is measured. Such structural changes are liable to accelerate the diffusion of oxygen through the coating to the substrate, via the grain joints or microcracks. The coating must therefore be able to maintain its structural integrity at the highest possible temperatures.

The heat resistance results obtained for the wafers coated in the preceding example are collated in Table 2.

2.1. Heat Resistance of an Amorphous Si/CrC Wafer Under an Inert Atmosphere

A silicon substrate passivated with a layer of a few hundred nanometers composed of amorphous silicon nitride (generally $Si_3N_4$), which is commercially available, is used to avoid any diffusion with the protective layer deposited on its surface.

These results indicate that the amorphous chromium carbide coating preserves its physical integrity up to 800° C. under an inert atmosphere of argon.

2.2. Heat Resistance of a Partially Metastable Si/Cr Wafer Under an Inert Atmosphere A silicon substrate passivated as previously is coated with partially metastable chromium according to the conditions of Table 1 (specific conditions: deposition temperature=400° C., deposition pressure=6700 Pa).

It is then placed in the reactor flushed with a stream of argon, in which it is gradually heated from 30° C. to 600° C. at a temperature increase rate of 1° C./second. In parallel, it is analyzed by XRD (acquisitions of 35 minutes each at 30° C. and every 50° C. from 350° C.).

Analysis of these spectra shows that the partially metastable chromium is polycrystalline: it contains a stable phase (Im-3m) and a metastable phase (Pm-3n).

The metastable phase (Pm-3n) disappears after 450° C. In parallel, the stable phase (Im-3m) remains throughout the heat treatment, the corresponding XRD peaks become finer and more intense by virtue of the improvement in the crystallinity.

Above 550° C., chromium oxide $Cr_2O_3$ appears as a result of the traces of oxygen present in the in situ analysis chamber.

On conclusion of the temperature cycle, the sample is cooled naturally to 30° C.: the metastable phase is no longer present, since it has undergone an irreversible transformation. Only the stable phase remains, along with chromium oxides in small proportion.

These results indicate that the chromium metal coating has a heat resistance under an inert atmosphere in accordance with conventional chromium of centered cubic (bcc) structure which is stable under normal conditions.

Moreover, it is seen that the minor phase of metastable chromium becomes transformed at about 450° C. to form the main stable chromium phase: this is coherent with the literature which states that metastable chromium is transformed into stable chromium after 450° C.

2.3. Heat Resistance of an Amorphous Si/CrSiC and Steel/CrSiC Wafer Under an Inert Atmosphere A passivated silicon substrate is coated with an amorphous mixed chromium silicon carbide according to the conditions of Table 1 (specific conditions: mole ratio of diphenylsilane to BEBC=15%, deposition temperature 450° C.), and is then placed in the reactor flushed with a stream of argon. This sample is heated from 30° C. to 750° C. at a temperature increase rate of 1° C./second while in parallel being analyzed by XRD (acquisitions every 50° C. from 400° C.).

In a similar manner to these operating conditions, a 304L stainless-steel substrate coated with an amorphous mixed chromium silicon carbide at a deposition temperature of 500° C. is also analyzed by XRD (acquisitions every 50° C. from 600° C.) during heating from 30° C. to 1100° C.

Comparative analysis of the XRD spectra for these two samples shows similar behavior: the amorphous nature disappears at about 750° C. by crystallization of a chromium carbide $Cr_7C_3$ and of the compound $CrSi_2$. Furthermore, it shows that since $CrSi_2$ appears on the two substrates, this compound is formed with the silicon of the coating and not that of the substrate, the silicon nitride passivation layer applied previously to the surface of the silicon substrate constituting a diffusion barrier.

Above 750° C., other crystalline phases appear: $Cr_2O_3$ after 850° C. and $Cr_3C_2$ after 1000° C. It is thus noted that the addition of Si to the chromium carbide coating delays its crystallization toward higher temperatures (750° C. instead of 580° C.).

3. Evaluation of the Oxidation in Air

3.1. Resistance to Oxidation in Air at 25° C. of an Amorphous Zr/CrC Wafer

In order to evaluate its resistance to mild oxidation at room temperature, a wafer based on the zirconium alloy Zircaloy-4 (dimensions: 45 mm×14 mm×1 mm) is coated with a single 4 μm protective layer of amorphous chromium carbide in accordance with the deposition conditions indicated in Table 1 for coating 1 (deposition temperature=450° C., deposition pressure=6700 Pa). It resides in air at room temperature for a few days, which results in very mild surface oxidation of the chromium carbide coating due to the passage into the ambient air, as for the majority of metals and alloys.

The elemental composition by mass according to the depth in this sample is then determined for the elements zirconium, chromium, oxygen and carbon by glow discharge spectrometry (GDS). It is shown in FIG. 1 and reveals the presence of a nonzero oxygen content at the interface between the substrate and the coating.

The mean coating composition values found via this technique are in agreement with those measured by microprobe (EPMA, Electron Probe Micro-Analyzer): as weight percentages relative to the total mass of the wafer, 90% of Cr, slightly less than 10% of C and a few % of O, which corresponds in atomic percentages to a composition close to $Cr_7C_3$.

The Transmission Electron Microscopy (TEM) images shown in FIGS. 2A and 2B are acquired using a microscope (JEM 2100 sold by the company Jeol) equipped with a field emission gun operating at 200 kV: the zones delimited on these images confirm this result of the profile of FIG. 1, among others the presence of a layer of zirconium oxide $ZrO_2$ (zone b) with a thickness of less than 400 nm, which is at the interface between the non-oxidized substrate (zone a) and the coating (zone c).

These results are confirmed by complementary analyses by Energy Dispersion Spectroscopy (EDS) which indicate a composition, in atomic percentages, of about 40% of O and 60% of Zr on the oxidized interfacial zone as opposed to 5% of O and 95% of Zr on the non-oxidized zone of the substrate.

The formation of a passivation layer at the surface of the Zircaloy-4 is normal in the absence of specific surface stripping. This layer may possibly disappear in the course of the oxidation and temperature increase experiments.

The Zircaloy-4 substrate was already surface-oxidized on receipt. No other source of oxidation could be identified during the phase of deposition of the chromium carbide protective layer. The sample thus coated underwent no additional oxidation on conclusion of storage in air under the ambient temperature conditions.

3.2. Resistance to Oxidation in Air at 800° C. of an Amorphous Si/CrC Wafer

The silicon wafer covered with amorphous CrC manufactured according to the conditions of Example 2.1 is subjected to aging in air at 800° C. for increasing times of 15, 30, 45, 60, 90, 120 and 180 minutes. For each temperature, the sample is cooled naturally and then analyzed by XRD at room temperature.

Analysis of the XRD spectra shows that, under air at 800° C.:
- after 15 minutes of treatment, the same three phases seen previously appear: $Cr_7C_3$, $Cr_3C_2$ and $Cr_2O_3$. The amorphous phase appears to disappear since no broad spread-out lump is visible at about 2 theta=30°;
- after 90 minutes at 800° C., there is virtually no more $Cr_2O_3$, as if the oxygen had consumed all the chromium belonging to the carbides. Residual peaks characteristic of $Cr_3C_2$ are still present, even after 180 minutes at 800° C.

These results indicate that the amorphous chromium carbide coating withstands oxidation in air at 800° C. for at least 15 minutes. Beyond these conditions, it begins to be oxidized and to crystallize.

3.3. Resistance to Oxidation as a Function of the Temperature in Dry or Humid Air of Bare or Coated Zr or Mo Wafers In order to study the resistance to oxidation in dry or humid air as a function of the temperature, thermogravimetric analyses (TGA) are performed on TGA wafers (dimensions: 6 mm×4 mm×1 mm, wafers pierced with a hole 1 mm in diameter and then suspended on the beam of the TGA balance) of Zircaloy-4 or molybdenum coated by the manufacturing process of the invention with protective layers of various compositions (amorphous CrC, partially metastable Cr or amorphous $Cr_xSi_yC_z$) and various thicknesses (9 μm, between 5 μm and 6 μm, or between 2 μm and 3 μm).

The deposition conditions are those of Table 1 for the corresponding protective layers which cover all the faces of the wafers. These conditions are completed by the following specific parameters:
 amorphous CrC: T=450° C. and P=6700 Pa;
 partially metastable Cr: T=400° C.;
 amorphous CrxSizCy: T=500° C.

These analyses consist in gradually heating each sample from 25° C. to 1200° C. at a temperature increase rate of 40° C./minute, and then in maintaining a temperature of 1200° C.

They are performed with dry or humid air (27.5% relative humidity).

The progress of the oxidation of each sample is evaluated by measuring its gain in mass (due to the formation of oxide).

For comparative purposes, each analysis is repeated on a wafer without a protective layer.

3.3.1. Results for an Amorphous Zr/CrC Wafer

Zircaloy-4 wafers of various thicknesses (2 μm, 5 μm or 9 μm) each covered with a protective layer of amorphous CrC are subjected to TGA analysis in air between 25° C. and 1200° C. For comparative purposes, an uncoated Zircaloy-4 wafer is subjected to the same analysis.

As illustrated in FIGS. 3A (dry air) and 3B (humid air), during the temperature increase from 25° C. to 1200° C. on a Zircaloy-4 substrate coated with amorphous CrC, the gains in mass change in an equivalent manner in dry air or in humid air, irrespective of the thickness of the protective layer.

On the other hand, in comparison, the extent of the oxidation is much less than that for the bare substrate: the coated substrate gains only about 0.15% in mass as opposed to about 3% mass for the bare substrate, i.e. 20 times more.

Figure 3C:
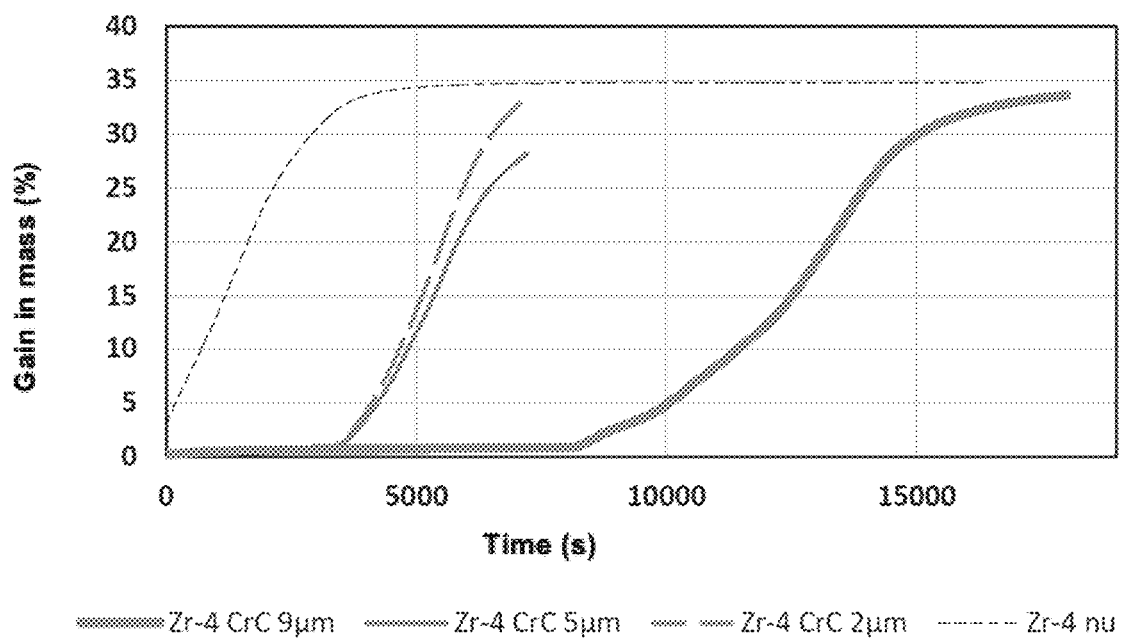
FIGS. 3C and 3D illustrate, respectively, after exposure to dry air and to humid air, the gain in mass at 1200° C. as a function of time for Zircaloy-4 wafers covered with various thicknesses of a protective layer of amorphous CrC and for a bare Zircaloy-4 wafer.
Figure 3D:
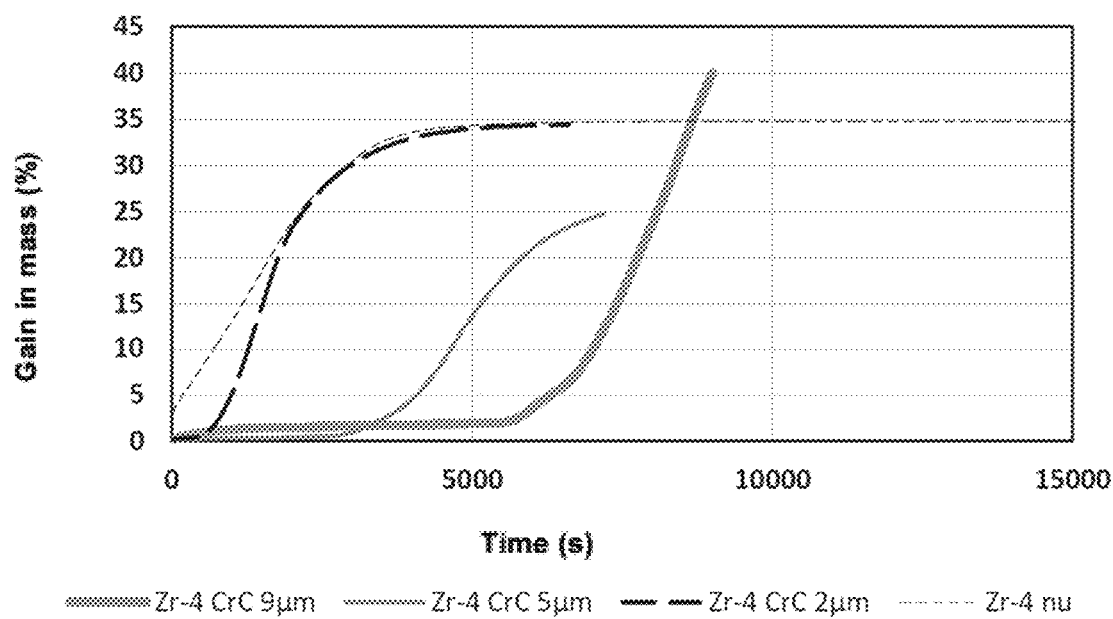

During the temperature stage at 1200° C., the three Zircaloy-4 substrates coated with amorphous CrC become gradually oxidized over time. This slowing-down in catastrophic oxidation at and beyond which the substrate disintegrates is smaller for the humid air atmosphere which is the more oxidizing (FIG. 3D) relative to the dry air (FIG. 3C), but advantageously increases with the thickness of the protective layer.

XRD analyses appear to indicate that three crystalline phases coexist in the coating: crystalline $Cr_2O_3$, amorphous chromium oxides and amorphous chromium carbide CrC.

In comparison, the bare substrate becomes immediately oxidized to $ZrO_2$.

The oxygen penetration is thus total in the bare substrate, whereas it is blocked or greatly limited up to 900° C. Above this temperature, it becomes partial and gradual in the coated substrates, since the amorphous CrC coating slows down the oxidation kinetics.

The amorphous CrC coating thus indeed protects against and/or delays the oxidation of the Zircaloy-4 substrate during heating from 25° C. to 1200° C., even in humid air. This beneficial effect increases with the thickness of the coating.

3.3.2. Results for an Amorphous Mo/CrC Wafer

Molybdenum wafers of various thicknesses (2 μm or 5 μm) each covered with a protective layer of amorphous CrC are subjected to TGA analysis in air between 25° C. and 1200° C. For comparative purposes, an uncoated molybdenum wafer is subjected to the same analysis.

Figure 4A:
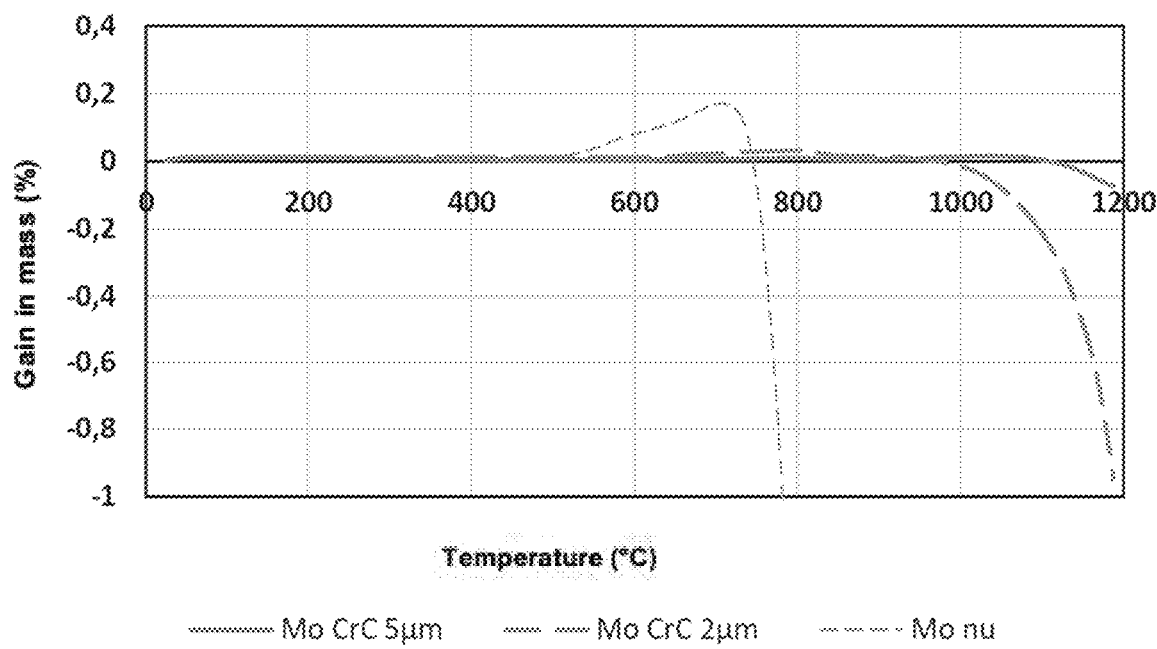
FIGS. 4A and 4B illustrate, respectively, after exposure to dry air and to humid air, the gain in mass as a function of the temperature for molybdenum wafers covered with various thicknesses of a protective layer of amorphous CrC and for a bare molybdenum wafer.
Figure 4B:
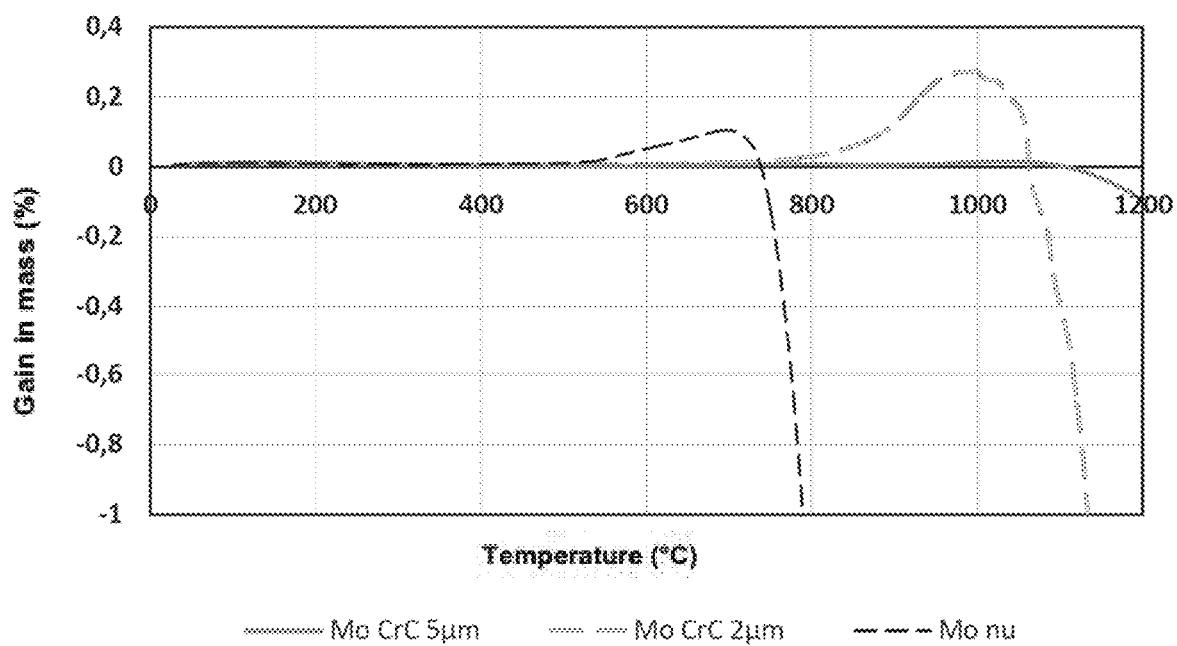

As illustrated in FIGS. 4A (dry air) and 4B (humid air), during the temperature increase from 25° C. to 1200° C. on a molybdenum substrate coated with amorphous CrC, the gains in mass change less quickly in dry air than in humid air, which is a more oxidative atmosphere. Moreover, the thicker the amorphous CrC coating, the later the sample becomes oxidized and the more it is capable of withstanding high temperature: up to about 1000° C. for a 2 μm coating, or even more than 1100° C. for a 5 μm coating.

The resistance to oxidation for greater thicknesses of the amorphous CrC coating could not be tested: it should nevertheless change favorably.

In comparison, the bare molybdenum substrate becomes oxidized immediately in dry or humid air: above 600° C. after a gain in mass due to the formation of molybdenum oxide, the bare substrate is then totally destroyed by formation of volatile oxides, which leads to rapid and negative losses of mass.

Since the various samples are rapidly destroyed at a temperature of 1200° C., the corresponding isothermal TGA analysis is not illustrated.

The amorphous CrC coating thus indeed protects against and/or delays the oxidation of the molybdenum substrate during heating from 25° C. to 1100° C., even in humid air. This beneficial effect increases with the thickness of the coating.

3.3.3. Results for a Partially Metastable Zr/Cr Wafer

Zircaloy-4 wafers are each covered with nine protective layers of partially metastable Cr so as to form multilayer coatings of different thicknesses (4 μm or 6 μm).

The stack of the nine protective layers is made by injecting the mother solution for 15 minutes and then stopping it for 5 minutes: a multilayer coating is thus obtained by repeating this deposition/pause cycle nine times.

The resumption of injection after the 5-minute pause creates an interface which may be visualized by TEM analysis of the multilayer coating.

This avoids the columnar growth and densifies the coatings.

The coated wafers are subjected to TGA analysis in air between 25° C. and 1200° C. For comparative purposes, an uncoated Zircaloy-4 wafer is subjected to the same analysis.

Figure 5A:
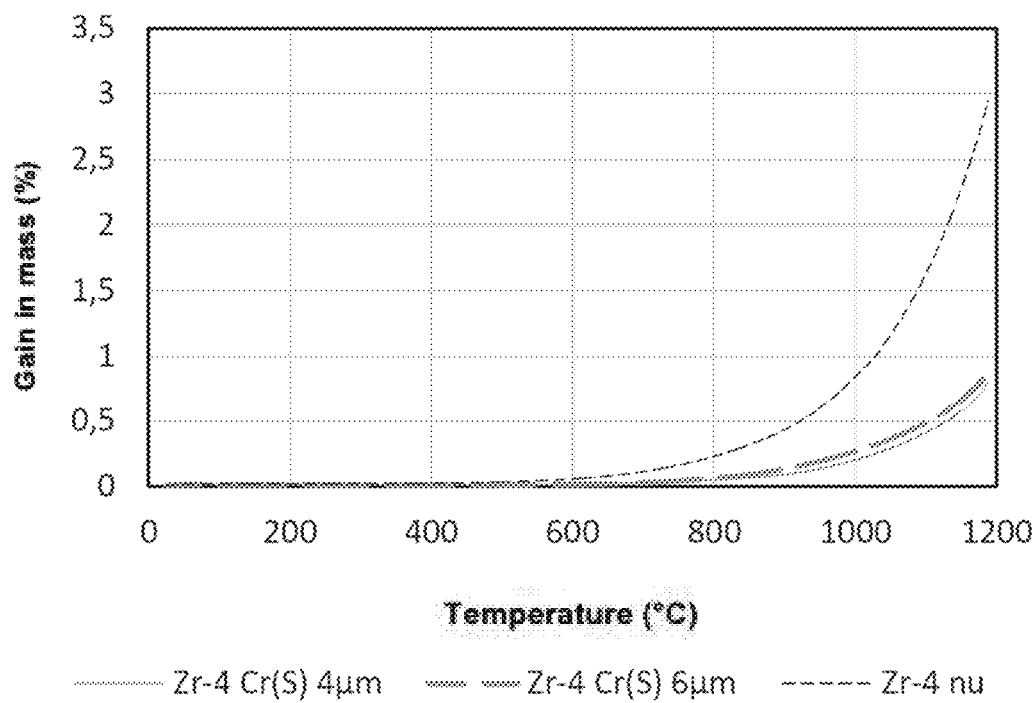
FIGS. 5A and 5B illustrate, respectively, after exposure to dry air and to humid air, the gain in mass as a function of the temperature for Zircaloy-4 wafers covered with various thicknesses of a protective layer of partially metastable chromium and for a bare Zircaloy-4 wafer.
Figure 5B:
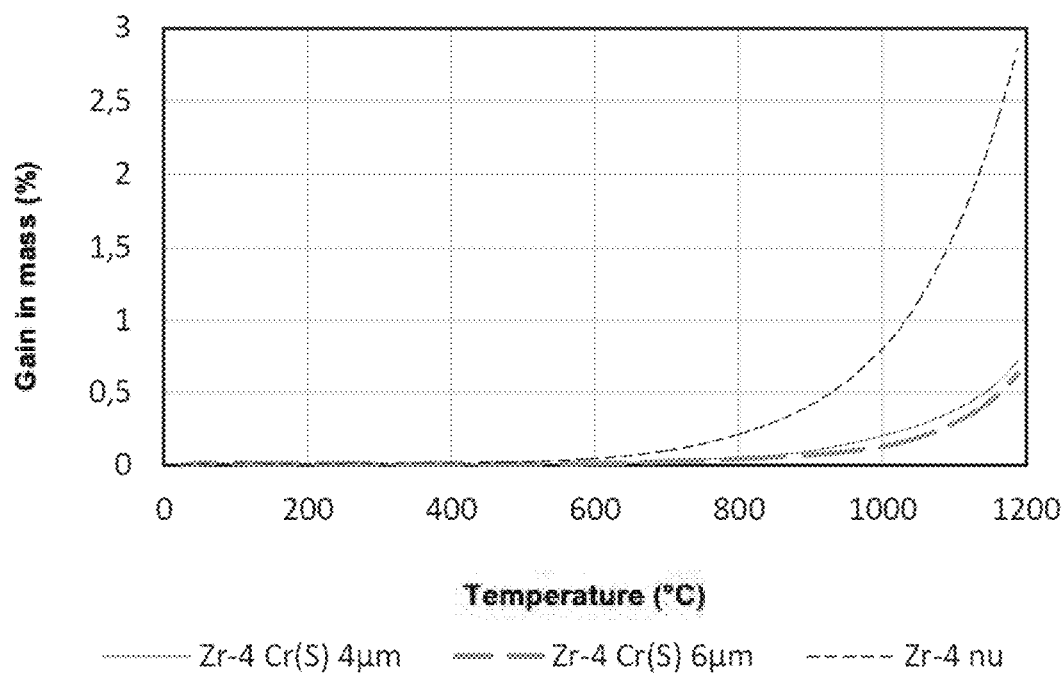

As illustrated in FIGS. 5A (dry air) and 5B (humid air), during the temperature increase from 25° C. to 1200° C. on a Zircaloy-4 substrate coated with partially metastable Cr, the gains in mass change in an equivalent manner in dry air or in humid air, irrespective of the thickness of the protective layer.

On the other hand, in comparison, the extent of the oxidation is smaller than that for the bare substrate: the substrate coated with partially metastable Cr gains only about 0.8% in mass as opposed to about 3% mass for the bare substrate (i.e. 3.75 times more), which is nevertheless less protective than the amorphous CrC coating analyzed previously with a gain in mass equal to 0.15%.

Figure 5C:
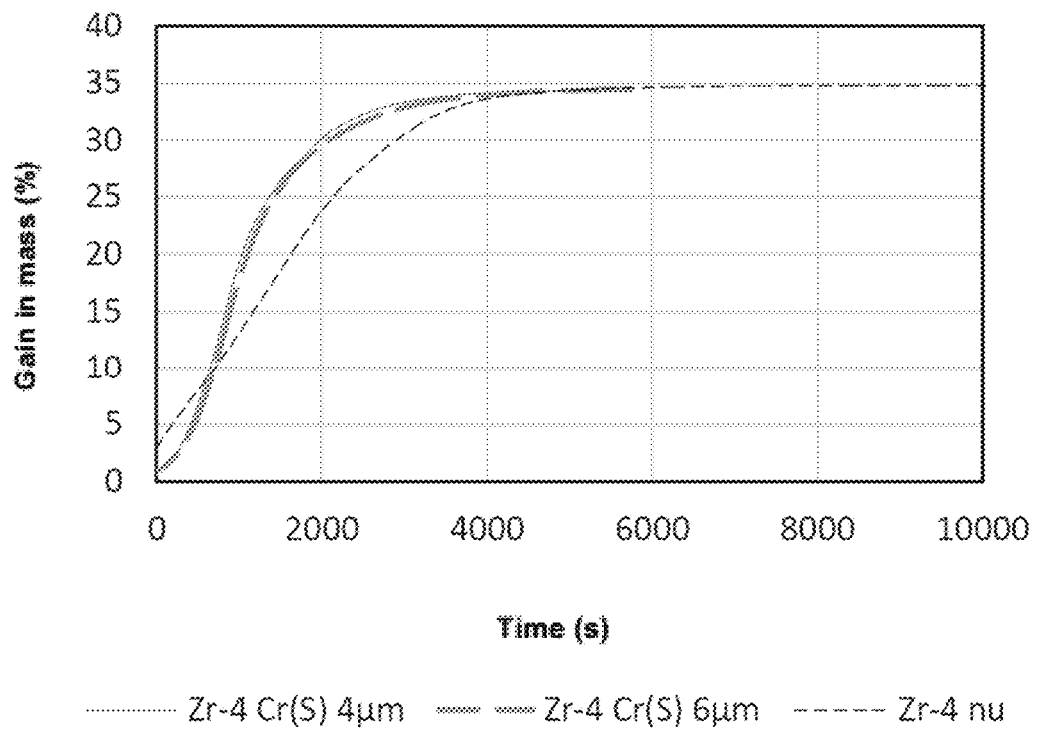
FIGS. 5C and 5D illustrate, respectively, after exposure to dry air and to humid air, the gain in mass at 1200° C. as a function of time for Zircaloy-4 wafers covered with various thicknesses of a protective layer of partially metastable chromium and for a bare Zircaloy-4 wafer.
Figure 5D:
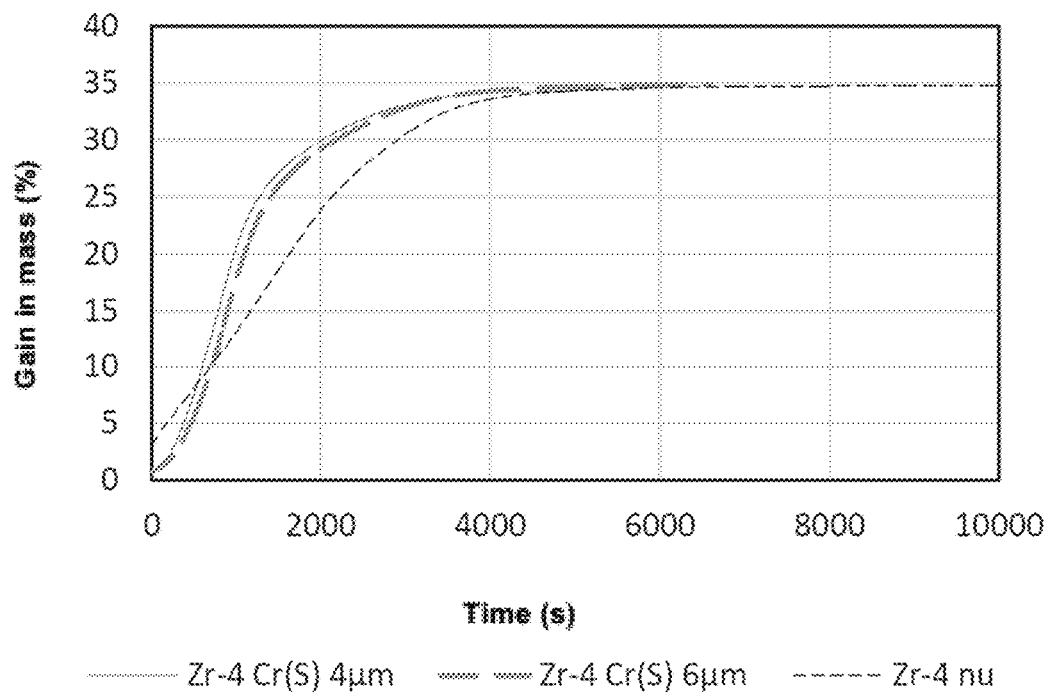

During the temperature stage at 1200° C., the two Zircaloy-4 substrates coated with partially metastable Cr become gradually oxidized over time as illustrated by FIGS. 5C (dry air) and 5D (humid air). Compared with what was found with the amorphous Zr/CrC wafer (Example 3.3.1), the multilayer coating of partially metastable Cr shows in the first seconds a delay of oxidation in comparison with the bare substrate, rapidly followed by an acceleration of this oxidation.

The origins of this unfavorable acceleration at 1200° C. relative to the bare substrate have not yet been entirely elucidated. At this stage, various hypotheses are being studied with a view to optimizing the protective effect of the partially metastable Cr coating with respect to oxidation.

However, advantageously, even at 1200° C., the partially metastable Zr/Cr wafer shows less substantial desquamation than the bare Zr wafer, which ensures better mechanical strength.

XRD analyses indicate that, on conclusion of the temperature stage at 1200° C., all of the partially metastable Cr coating is oxidized to $Cr_2O_3$ and the substrate to $ZrO_2$.

The partially metastable Cr coating greatly prevents or greatly limits the penetration of oxygen up to about 900° C., above which temperature this penetration becomes partial and gradual.

The partially metastable Cr coating thus indeed protects against and/or delays the oxidation of the Zircaloy-4 substrate.

3.3.4. Results for a $Zr/Cr_xSi_yC_z$ Wafer

A Zircaloy-4 wafer 4 μm thick covered with a protective layer of amorphous mixed chromium silicon carbide $Cr_xSi_yC_z$ is subjected to TGA analysis in dry or humid air between 25° C. and 1200° C. with a temperature stage at 1200° C. For comparative purposes, an uncoated Zircaloy-4 wafer is subjected to the same analysis, the oxidation in dry or humid air giving, in this case, identical results.

Figure 6A:
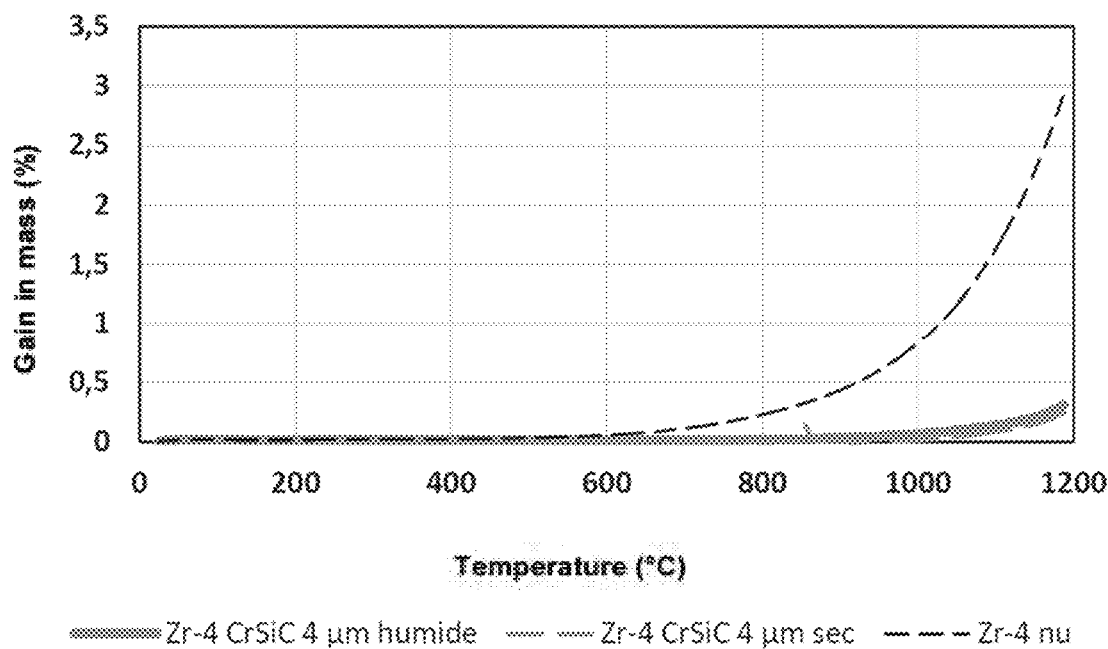
FIGS. 6A and 6B illustrate, respectively, as a function of the temperature and as a function of the time at 1200° C., the gain in mass for a Zircaloy-4 wafer covered with a protective layer of mixed amorphous chromium silicon carbide $Cr_xSi_yC_z$ and for a bare Zircaloy-4 wafer, in dry air and in humid air.

As illustrated in FIG. 6A (25° C. to 1200° C.), the gain in mass changes similarly in dry air or in humid air for the Zircaloy-4 substrate coated with amorphous mixed chromium silicon carbide $Cr_xSi_yC_z$: the oxidation is delayed up to 700° C. in humid air and 800° C. in dry air. In comparison with the bare substrate, the coated substrate shows better resistance to oxidation.

Figure 6B:
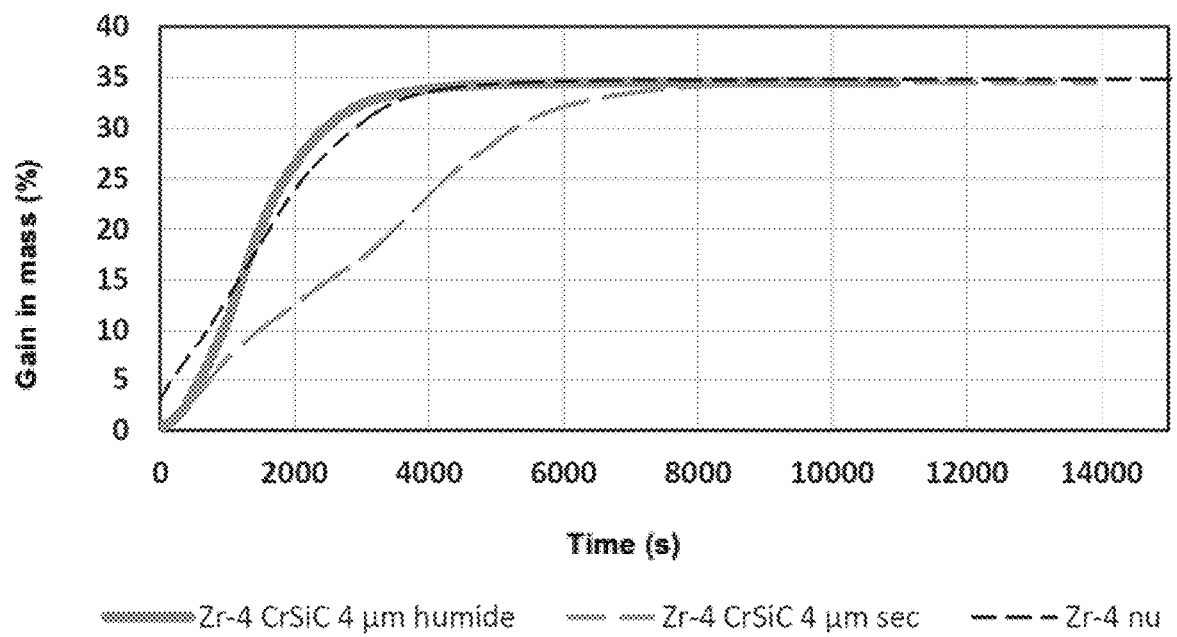

FIG. 6B (stage at 1200° C.) logically shows better resistance to oxidation in dry air than in humid air of the Zircaloy-4 substrate coated with amorphous mixed chromium silicon carbide $Cr_xSi_yC_z$, without, however, improving this property relative to the bare substrate.

However, advantageously, even at 1200° C., the $Zr/Cr_xSi_yC_z$ wafer shows less substantial cracking and swelling than the bare Zr wafer, which ensures better mechanical strength.

XRD analyses indicate that, on conclusion of the temperature stage at 1200° C., all of the amorphous mixed chromium silicon carbide $Cr_xSi_yC_z$ coating is oxidized (among others to $Cr_2O_3$ for chromium) and the substrate to $ZrO_2$.

The amorphous mixed chromium silicon carbide $Cr_xSi_yC_z$ coating thus indeed protects against and/or delays the oxidation of the Zircaloy-4 substrate. Its resistance to oxidation and its mechanical strength are of intermediate magnitude relative to those of amorphous CrC and of partially metastable Cr.

3.3.5. Evaluation of the Resistance to Oxidation and to Hydriding after Exposure of a Zr/CrC Wafer to 1100° C. Followed by Quenching in Water Zircaloy-4 wafers (dimensions: 45 mm×14 mm×1 mm) of three different thicknesses (2 μm to 3 μm, 5 μm to 6 μm, or 9 μm) each covered with a protective layer of amorphous CrC as used in Example 3.3.1 are oxidized in dry air for 14 minutes, and then subjected to quenching in water for 10 seconds.

Figure 7A:
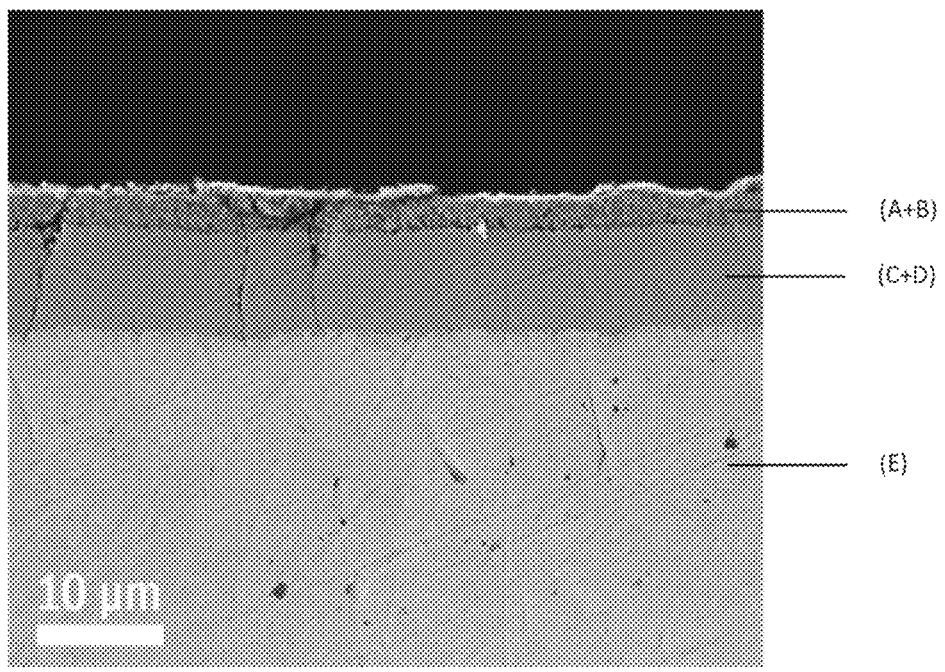
FIGS. 7A (viewed from one side of the wafer) and 7B (particular focus on one corner of the wafer) are Scanning Electron Microscopy (SEM) images illustrating a cross section of a Zircaloy-4 wafer covered with a protective layer of amorphous CrC deposited via the manufacturing process of the invention, subjected to oxidation at 1100° C. followed by quenching in water.
Figure 7B:
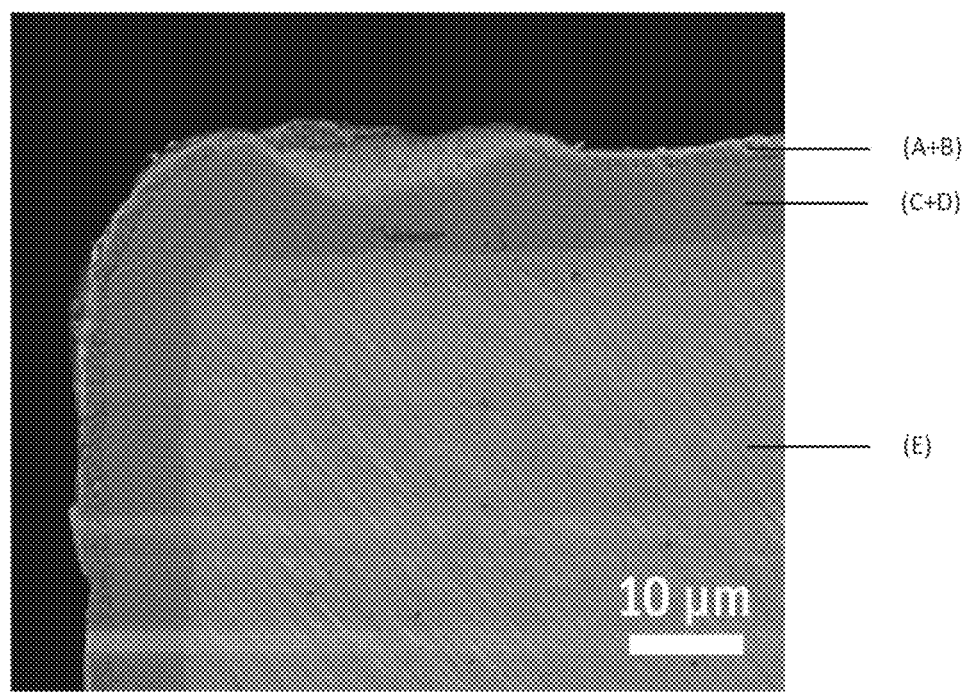
FIG. 7C is an SEM image corresponding to FIG. 7A in which wafers each covered with a protective layer of various thicknesses are grouped (left-hand image: thickness of 9 μm, central image: thickness of 5 to 6 μm, right-hand image: thickness of 2 to 3 μm).
FIG. 7D illustrates the GDS analysis of the wafer with a thickness of 9 μm.

The Scanning Electron Microscopy (SEM) images of a 9 μm section of the wafer resulting from this treatment are shown in FIGS. 7A and 7B (zoom into a corner of the wafer): although the substrate has a rough finish, i.e. it has a certain surface roughness, the coating is of uniform thickness and it perfectly covers all the unevennesses. The mechanical strength of the wafers is also preserved.

The absence of degradation of the Zircaloy-4 on conclusion of this test at 1100° C. with quenching in water is coherent with the oxidation of Zircaloy-4 which increases as a function of the temperature and is significant only at and above 1200° C. (Example 3.3.1). The lower temperature (1100° C.) and the short time (14 minutes) are such that the oxidation is limited here to the coating (see FIGS. 7A and 7B) which ensures good protection of the Zircaloy-4.

In accordance with GDS profiles not shown herein, three main layers of different chemical composition may be identified on the SEM images of FIGS. 7A and 7B, i.e. going from the external medium to the Zircaloy-4 substrate:

- an outer layer of oxidized coating about 4 μm thick comprising a zone A of 2 μm of surface chromium oxides ($Cr_2O_3$) and a zone B of 2 μm of partially oxidized coating ($Cr_3C_2$ resulting from the recrystallization of the amorphous CrC during the temperature increase+$Cr_2O_3$);
- an intermediate layer comprising a zone C of non-oxidized coating (amorphous CrC) at the interface with the outer coating and with a zone D formed from chromium and carbon which has diffused into the Zircaloy-4 with which it is at the interface (with possible formation of cubic zirconium carbide ZrC with a lattice parameter of about 4.7 Å, in particular for the thinnest coating of 2 μm to 3 μm);
- a layer formed from Zircaloy-4 (zone E).

The amorphous CrC coating thus protects the Zircaloy-4 substrate with respect to oxidation for the three wafers, since no formation of $ZrO_2$ is detected. Only the coating is partially oxidized to $Cr_2O_3$.

Table 3 collates the thicknesses evaluated by GDS for zones A, B, C and D for the three Zr/CrC wafers, and also the corresponding overall gains in mass.

TABLE 3

| Initial thickness CrC (μm) | Zone A: Thickness $Cr_2O_3$ (μm) | Zone B: CrCO transition zone thickness (μm) | Zone C: Thickness CrC (μm) | Zone D: Thickness of diffusion zone in substrate (μm) | Gain in mass (mg · cm$^{-2}$) |
|---|---|---|---|---|---|
| 9 | 1.5 | 2.5 | 3 | 15 | 0.414 |
| 5-6 | 1.5 | 2.5 | 2 | 11 | 0.543 |
| 2-3 | 1.5 | 2.5 | 1 | 6 | 0.288 |

Figure 7C:
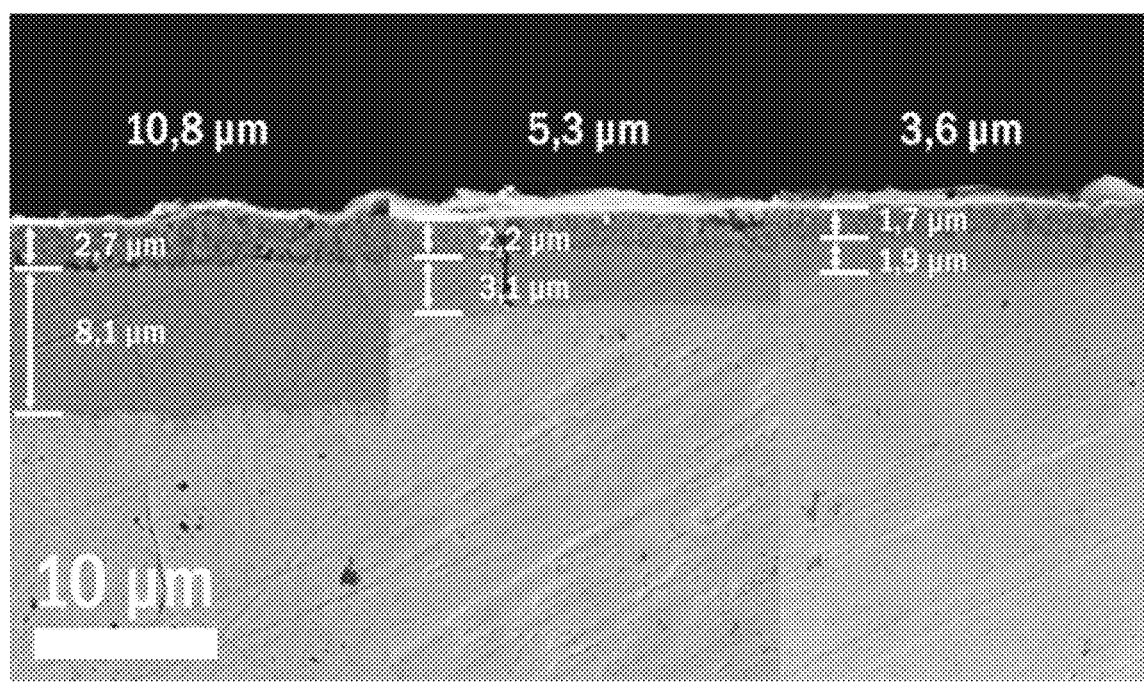

Table 3 is completed by FIG. 7C which groups the SEM images of a cross section for each of the three wafers, given that the total thickness of the oxidized coating is greater than the thickness of the initial protective coating. The SEM image of the wafer 5 µm to 6 µm thick shows a crack resulting from accidental rupture of the initial coating.

Table 3 and FIG. 7C show that the greater the thickness of the initial CrC coating, the thicker the non-oxidized coating (zone C) and the thicker also is the diffusion zone of the non-oxidized coating in the substrate (zone D). On the other hand, the thickness of the oxidized coating (zone A) does not change: about 2 µm of $Cr_2O_3$ and 2 µm of partially oxidized transition zone (chromium oxycarbide) (zone B). Since the oxidation phenomenon is superficial, and since the oxidation conditions are the same, it is coherent that the thickness of $Cr_2O_3$ and of the transition zone should be identical insofar as the CrC coating has not all been consumed. The oxidation is partial depending on the thickness: less than half of the total thickness of the coating is oxidized for the thinnest coating (2 µm to 3 µm) and a quarter for the thickest (9 µm).

The gain in mass is greater for the wafer with a protective layer 9 µm thick, which is also illustrated by FIG. 7C which shows greater progress of the oxidation within the coating. The ratio of the gain in mass between the wafers with a 9 µm coating and a 2-3 µm coating is comparable to the ratio of the oxidized coating thicknesses: 1.44 versus 1.59.

Complementary analyses show that the elemental compositions of the coatings are comparable for each wafer in oxidized and non-oxidized zones, with the curves reaching the same mass percentages and following the same trends. In particular, a diffusion of chromium and of carbon is observed in the Zircaloy-4 substrate, among others in the form of ZrC, which advantageously reinforces the adhesion of the coating to the substrate.

Moreover, the non-oxidized coating zone C (amorphous CrC) maintains a very dense microstructure, formed from small grains of crystalline chromium carbides of submicron size.

Figure 7D:
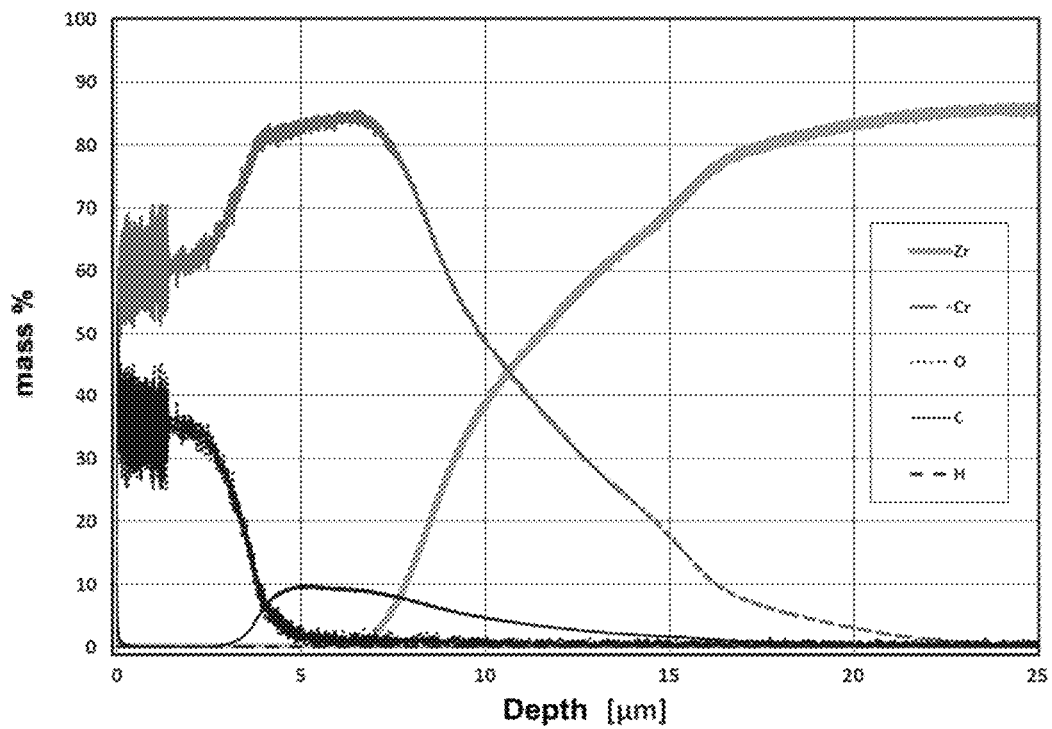

As regards the resistance to hydriding, GDS analysis of the 9 µm thick wafer illustrated by FIG. 7D shows a mass percentage of hydrogen of 10 ppm which is not significant in the Zircaloy-4 substrate after oxidation at 1100° C. followed by quenching in water, which confirms the hydrogen-permeation barrier property of the amorphous chromium carbide coating.

Even under oxidative conditions at 1100° C. followed by quenching, a nuclear component obtained via the manufacturing process of the invention can maintain a certain degree of mechanical integrity and have a comfortable residual margin of resistance to oxidation/hydriding.

3.3.6. Conclusion

Unexpectedly, the inventors have discovered that a nuclear component obtained by the manufacturing process of the invention has improved resistance to oxidation and/or hydriding, in particular at high and very high temperature, among others in the presence of water vapor.

Such properties cannot be anticipated with regard to the chemical and metallurgical specificities of zirconium and of the zirconium alloys used for nuclear applications, among others with regard to their chemical composition, surface state, crystalline texture, final metallurgical state (work-hardened or more or less recrystallized), which are properties that are liable to have an influence on the quality and behavior of the coatings.

In particular, at low temperature, the α phase of a zirconium alloy (denoted "Zr-α", of compact hexagonal crystalline structure) transforms into the β phase (denoted "Zr-β", of centered cubic crystallographic structure) in a temperature range typically extending from 700° C. to 1000° C. On passing from the Zr-α structure to the Zr-β cubic structure, the alloy undergoes local dimensional variations. These variations are in principle unfavorable to the mechanical strength of an outer layer which would cover a zirconium-based inner layer, on account among others of the incompatibility of their expansion coefficients. These adhesion difficulties are accentuated by the mechanisms of diffusion of chemical species that are faster in the Zr-β phase than in the Zr-α phase, and which can modify the interface between the substrate and its coating. Now, the various protective layers deposited via the manufacturing process of the invention have shown very good adhesion to a zirconium-based substrate, even under extreme conditions.

4. Microstructure of a Partially Metastable Si/Cr Monolayer or Multilayer Coating A passivated silicon substrate is provided with a partially metastable chromium monolayer coating according to the conditions of Example 2.2, or with a multilayer coating of similar thickness and chemical composition while additionally observing a waiting time of 5 minutes between the deposition of each of the nine constituent layers of the multilayer coating.

The microstructure of these coatings is illustrated by the SEM images represented by:

FIG. 8A: monolayer coating obtained with a deposition rate of 5 µm/hour;

FIG. 8B: monolayer coating obtained with a deposition rate of 3 µm/hour;

FIG. 8C: multilayer coating obtained with a deposition rate of 1 µm/hour.

These images show that the monolayer coatings have here a columnar microstructure, whereas the multilayer coating has an equiaxed microstructure. FIG. 8C in particular shows the interface which exists between each of the nine layers which are visualized individually within the multilayer coating.

Moreover, the density of the coating increases gradually while reducing the rate of deposition of the partially metastable chromium by reduction of the injection frequency and time. The density of the multilayer coating is estimated as 7.7±0.6 g·cm$^{-3}$ via RBS ("Rutherford Backscattering Spectrometry") analyses: taking the uncertainties into account, it is thus of the same order of magnitude as the optimum density of 7.2 g·cm$^{-3}$ for the stable solid chromium.

The deposition conditions thus have an influence on the microstructure of the coating and on its density. In general, the quality of a coating is inversely proportional to its deposition rate, as shown by the evolution from a porous columnar growth to a dense equiaxed growth obtained by reducing the deposition rate. Reducing the deposition rate may be obtained by reducing the deposition temperature, or by increasing the deposition pressure or the precursor concentration of the mother solution injected into the CVD deposition reactor.

5. Hardness of the Coatings

In order to measure the hardness of the coatings obtained previously or obtained under similar conditions, nanoindentation experiments are performed. For the amorphous CrC coating, the hardness measurements are performed on a coating obtained from fresh precursor (3.5 μm thick) or from precursor recycled under conditions similar to those presented in Example 6 (1 μm thick).

The nanoindentation machine is equipped with a Berkovich indenter (triangular-based pyramid with an angle of 65.270 between the vertical and the height of one of the faces of the pyramid). The measures are taken in compliance with the rule of the tenth: the indenter drives in by less than one tenth of the thickness of the coating. A measurement cycle takes place in three stages:
- increasing load up to the maximum load, in 30 seconds;
- maintenance of the maximum load for 30 seconds;
- removal of the load for 30 seconds.

The calculations made by the measurement and analysis software take into account a Poisson coefficient of the coating of 0.2.

The results are collated in Table 4.

The parameters "H" and "E" are the hardness and the Young's modulus.

The parameters "H/E" and "$H^3/E^2$" evaluate the durability of the coating:
- H/E: compares the elastic breaking strength or the abrasion resistance between different coatings.
- $H^3/E^2$: characterizes the elastic behavior of a material and is proportional to the resistance to penetration under load and to the plastic deformation.

TABLE 4

| Coating | Thickness (μm) | Substrate | H (GPa) | E (GPa) | H/E (–) | $H^3/E^2$ (GPa) |
|---|---|---|---|---|---|---|
| $Cr_xC_y$ | 3.5 | Zircaloy-4 | 22.7 ± 2.3 | 266.5 ± 25.2 | $8.5 \times 10^{-2}$ | $1.6 \times 10^{-1}$ |
| $Cr_xC_y$ recycled | 1.0 | Zircaloy-4 | 28.9 ± 6.4 | 315.0 ± 41.2 | $9.2 \times 10^{-2}$ | $3.6 \times 10^{-1}$ |
| Cr (S) columnar | 3.5 | Zircaloy-4 | 9.7 ± 0.8 | 344.8 ± 32.0 | $2.8 \times 10^{-2}$ | $7.7 \times 10^{-3}$ |
| Cr (S) dense | 5.5 | Zircaloy-4 | 16.9 ± 0.6 | 280.1 ± 72.7 | $6.0 \times 10^{-2}$ | $6.2 \times 10^{-2}$ |
| $Cr_xSi_zC_y$ | 5.5 | Zircaloy-4 | 19.9 ± 2.8 | 180.8 ± 17.6 | $1.1 \times 10^{-1}$ | $4.58 \times 10^{-1}$ |
| Cr solid | — | — | 6.1 ± 0.4 | 224.2 ± 21.4 | $2.7 \times 10^{-2}$ | $4.5 \times 10^{-3}$ |
| Zircaloy-4 solid | — | — | 4.4 ± 0.4 | 108.8 ± 15.7 | $4.0 \times 10^{-2}$ | $7.2 \times 10^{-3}$ |

For the various coatings, these results show that:
- partially metastable Cr: this coating has a high hardness, of about 17 GPa. This hardness is twice as high as that of the commercially available electrolytic hard chromium. It is in the high hardness range of solid metallic chromium, generally comprised between 6 GPa and 25 GPa depending on the production process.
- amorphous chromium carbide CrC: this coating has an appreciably high hardness, comprised between 22 GPa and 29 GPa. The best hardnesses are obtained when the precursors not consumed on conclusion of the manufacturing process of the invention are recycled.

In comparison, the hardness range of a chromium carbide of the prior art generally ranges between 5 GPa and 24 GPa depending on the process used and the deposition conditions.

The high hardness range of the amorphous chromium carbide coating obtained via the manufacturing process of the invention is unexpected: it is generally accepted that a chromium carbide is much less hard in amorphous form than in crystalline form, or even that the presence of carbon would soften a chromium-based coating.
- amorphous CrSiC: in comparison with the amorphous CrC coating, this coating has a hardness of about 20 GPa which is smaller, but, advantageously its Young's modulus of 180 GPa is much lower. The amorphous CrSiC coating thus has a very high durability (H/E=$11.1 \times 10^{-2}$ and above all $H^3/E^2$=$4.6 \times 10^{-1}$ GPa), which competes with high-durability coatings specially designed for this purpose.

6. Recycling of the Precursors

The example of a deposition process with recycling which follows is taken from patent application FR 1562862 (reference [12]). It relates to the deposition of an amorphous chromium carbide coating on a silicon substrate and illustrates by analogy the possibility of recycling one or more of the precursors or of derivatives thereof which remain on conclusion of the manufacturing process of the invention. The recycling is performed with a cryogenic trap.

The deposition of an amorphous chromium carbide CrC coating is performed under the following conditions:
Injection conditions:
  injector open time: 0.5 ms
  frequency: 10 Hz
Reagent: BEBC (5 g)
Solvent: Toluene (50 mL)
Carrier gas: $N_2$ (flow rate of 500 sccm, i.e. 500 cm$^3$/min under standard conditions)
Deposition time: 20 minutes
Deposition temperature: 450° C.; Deposition pressure: 6666 Pa
Evaporation temperature: 200° C.
Temperature of the cryogenic trap: −120° C.
Amount of daughter solution recovered: 30 mL Two experiments N1 and N2 were performed with a BEBC mother solution. In a third experiment, the two daughter solutions obtained on conclusion of N1 and N2 are recovered to form a recycled mother solution which is used as source of precursor for a third deposition operation N3.

For N1 and N2, the thickness of the coating is typically 5 μm. A coating about 1.5 μm thick is obtained on conclusion of N3. The concentration of BEBC is determined and the yield for N1 and N2 is calculated (see Table 5).

TABLE 5

| Experiment No. | Injected solution (ml) | [BEBC] in the injected solution (g/ml) | Daughter solution recovered (ml) | [BEBC] in the daughter solution (g/ml) | Yield relative to the precursor (%) |
|---|---|---|---|---|---|
| N1 | 55 | 0.078 | 30 | 0.031 | 60% |
| N2 | 50 | 0.083 | 30 | 0.034 | 59% |

TABLE 5-continued

| Experiment No. | Injected solution (ml) | [BEBC] in the injected solution (g/ml) | Daughter solution recovered (ml) | [BEBC] in the daughter solution (g/ml) | Yield relative to the precursor (%) |
|---|---|---|---|---|---|
| N3 | 30 + 30 | 0.040 | 35 | Not measured, since very small | N/A |

Complementary analyses show that the compositions and amorphous microstructures of the coatings do not depend on the precursor concentration of the injected solution. On the other hand, a daughter solution containing a recycled precursor makes it possible to deposit a coating with a hardness higher than that obtained with the initial precursor of the mother solution.

7. Geometry of the Nuclear Component According to the Invention

The nuclear component obtained via the manufacturing process of the invention is described on a cross section with reference to FIGS. 9A, 9B, 9C, 9D, 9E and 9F in the nonlimiting particular case of a tubular geometry.

When the nuclear component is solid or does not delimit any accessible internal volume, it generally does not comprise any coating deposited on the inner surface of the substrate.

Figure 9A:
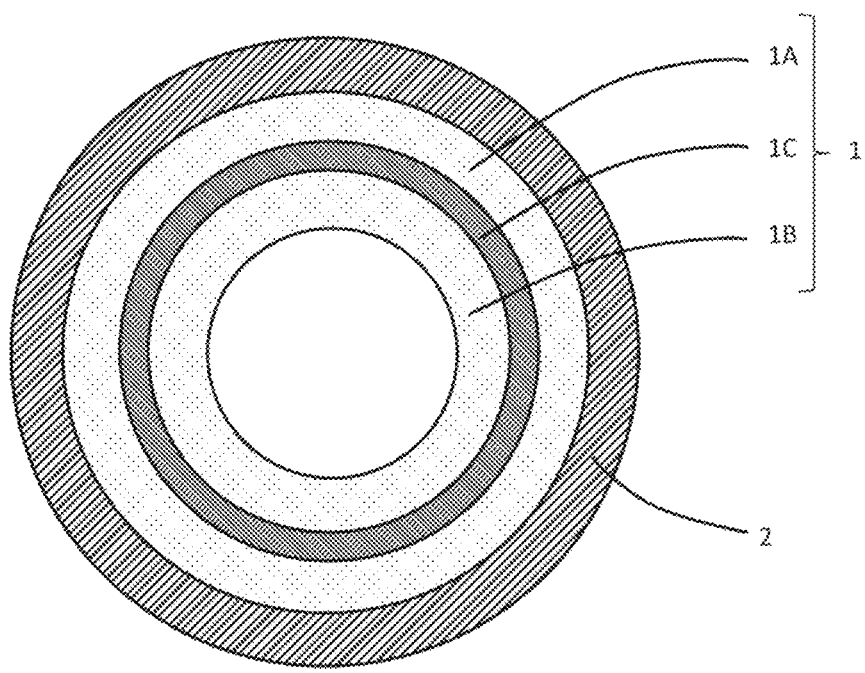
FIGS. 9A, 9B, 9C, 9D, 9E and 9F represent schematic views in cross section of some of the geometries of a tubular nuclear fuel cladding obtained by the manufacturing process of the invention.

According to a first embodiment of the invention, the cladding illustrated by FIG. 9A comprises a substrate 1 whose inner surface delimits a volume that is capable of receiving the nuclear fuel. The substrate 1 forms a support (not coated with an interposed layer for this embodiment) on which is placed a protective layer 2 composed of a protective material which improves the oxidation resistance of the cladding.

Figure 9B:
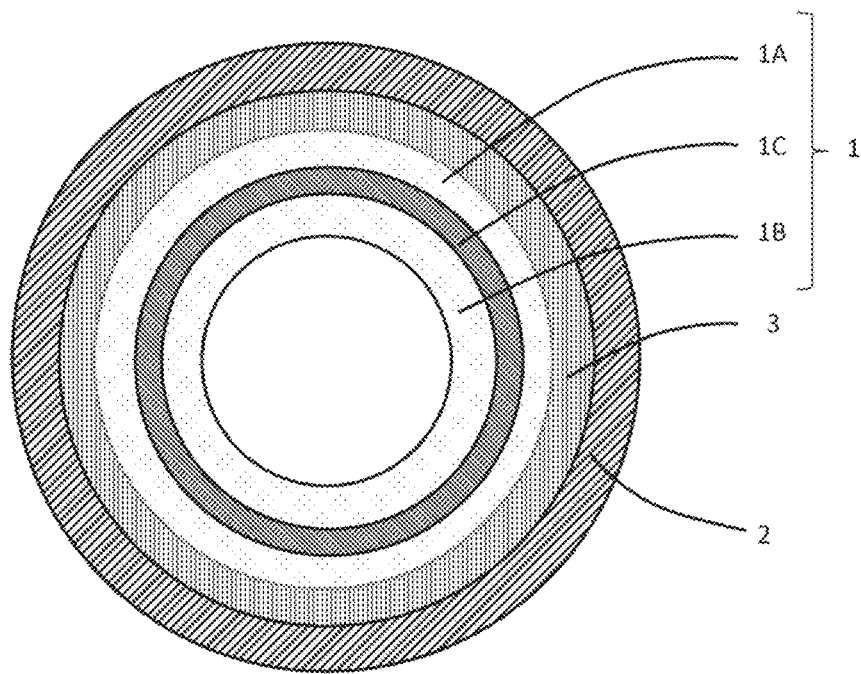

According to a second embodiment illustrated by FIG. 9B, the cladding is further provided with an interposed layer 3 placed between the substrate 1 and the protective layer 2. In this case, the combination of the substrate 1 and of the interposed layer 3 forms the support. The interposed layer 3 is composed of at least one interposed material which is capable of preventing or limiting the diffusion of the protective material of the protective layer 2 toward the substrate 1.

Figure 9C:
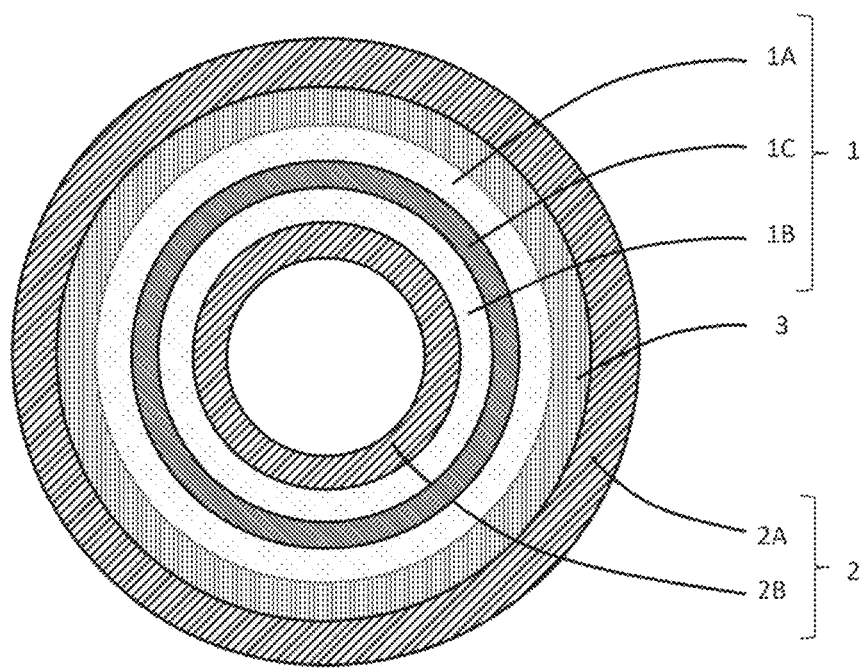

According to a third embodiment illustrated by FIG. 9C, the cladding according to the second embodiment (FIG. 9B) is further provided with an inner protective layer 2B in contact with the internal volume of the cladding and arranged here on the inner face of the substrate 1 (thus not coated with a liner for this embodiment). The inner protective layer 2B completes the protection imparted by the outer protective layer 2A.

Figure 9D:
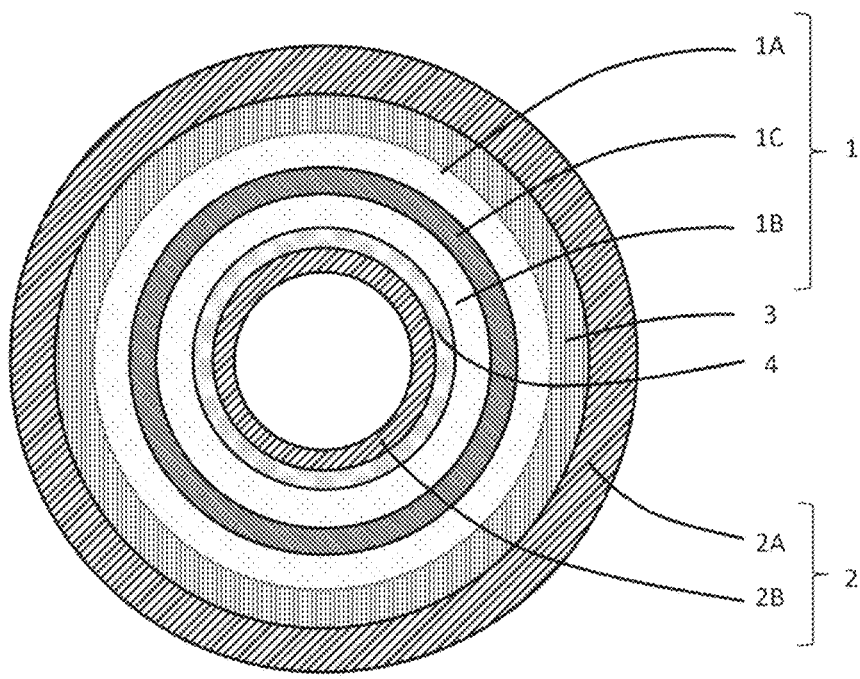

According to a fourth embodiment illustrated by FIG. 9D, the cladding according to the third embodiment (FIG. 9C) is further provided with a liner 4 positioned between the inner protective layer 2B and the substrate 1. The liner 4 constitutes a diffusion barrier.

Figure 9E:
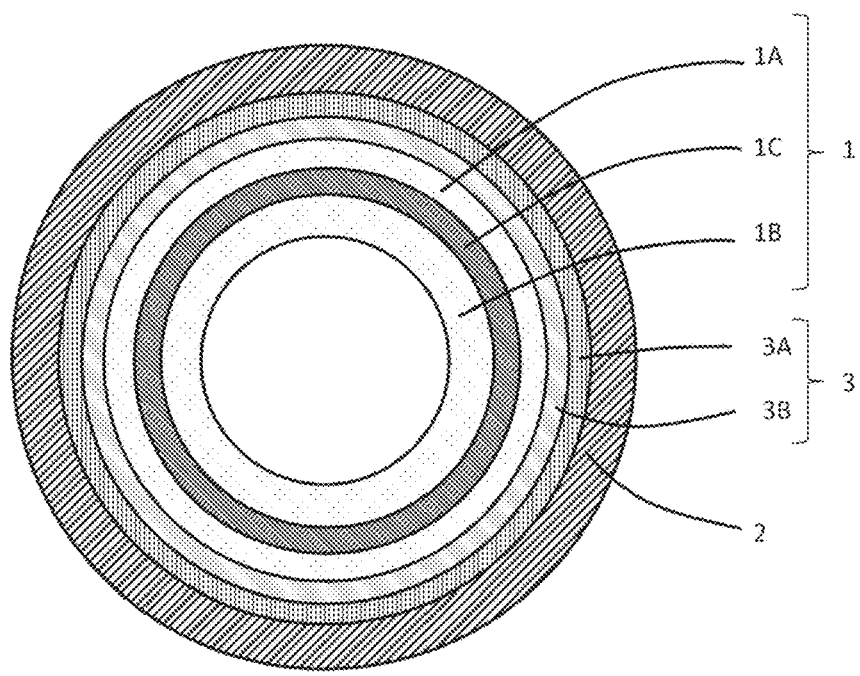

According to a fifth embodiment illustrated by FIG. 9E, the cladding according to the first embodiment (FIG. 9A) is further provided with a two-layer interposed layer 3 comprising an outer interposed layer 3A and an inner interposed layer 3B covering, respectively, the inner surface of the protective layer 2 and the outer surface of the substrate 1.

Figure 9F:
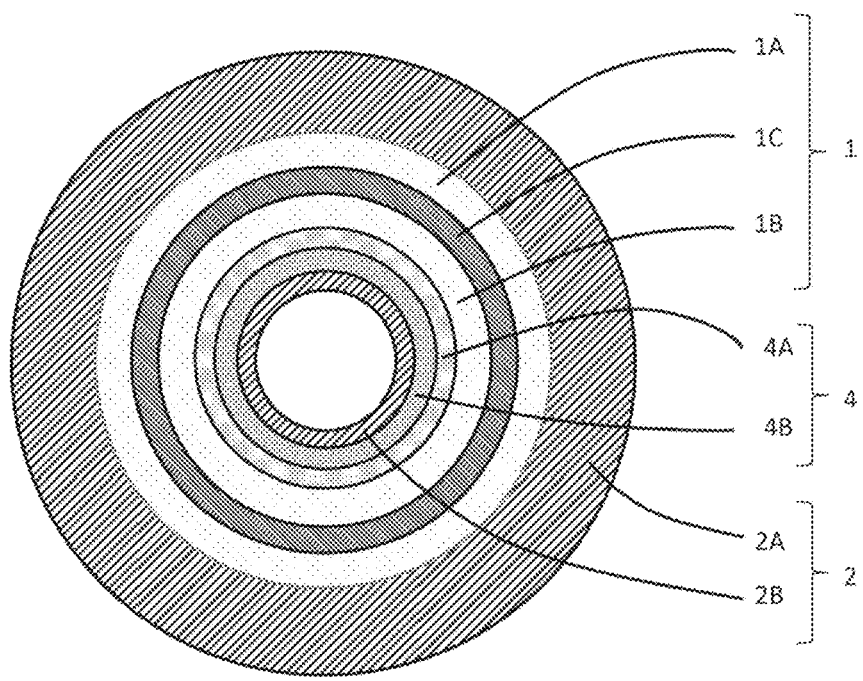

According to a sixth embodiment illustrated by FIG. 9F, the cladding according to the fourth embodiment (FIG. 9D), which nevertheless lacks the interposed layer 3, is further provided with a two-layer liner 4 positioned between the inner protective layer 2B and the substrate 1. The two-layer liner 4 comprises an upper liner 4A covering the inner surface of the support and/or a lower liner 4B covering the upper liner 4A. The inner protective layer 2B thus covers the lower liner 4B.

Needless to say, depending on the desired properties, other embodiments are possible as a function of the presence or absence in each embodiment of the interposed layer 3, of the outer protective layer 2A, of the inner protective layer 2B and/or of the liner 4.

The present invention is in no way limited to the embodiments described and represented, and a person skilled in the art will know how to combine them and to make thereof, by means of his general knowledge, numerous variants and modifications.

REFERENCES CITED

[1] WO 2013/017621
[2] F. Maury, A. Douard, S. Delclos, D. Samelor, C. Tendero; Multilayer chromium based coatings grown by atmospheric pressure direct liquid injection CVD; Surface and Coatings Technology, 204 (2009) 983-987.
[3] A. Douard, F. Maury; Nanocrystalline chromium-based coatings deposited by DLI-MOCVD under atmospheric pressure from Cr(CO)6; Surface and Coatings Technology, 200 (2006) 6267-6271.
[4] WO 2008/009714
[5] WO 2008/009715
[6] S. Anderbouhr, V. Ghetta, E. Blanquet, C. Chabrol, F. Schuster, C. Bernard, R. Madar; LPCVD and PACVD (Ti,Al)N films: morphology and mechanical properties; Surface and Coatings Technology, Volume 115, Issues 2-3, Jul. 18, 1999, pages 103-110.
[7] F. Ossola, F. Maury; MOCVD route to chromium carbonitride thin films using Cr(NEt2)4 as single-source precursor: growth and mechanism, Adv. Mater. Chem. Vap. Deposition, 3 (1997) 137-143.
[8] Jin Zhang, Qi Xue and Songxia Li, Microstructure and corrosion behavior of TiC/Ti(CN)/TiN multilayer CVD coatings on high strength steels. Applied Surface Science, 2013. 280: pages 626-631.
[9] A. Weber, C.-P. Klages, M. E. Gross, R. M. Charatan and W. L. Brown, Formation Mechanism of TiN by Reaction of Tetrakis(dimethylamido)-Titanium with Plasma-Activated Nitrogen. Journal of The Electrochemical Society, 1995. 142(6): pages L79-L82.
[10] Y. S. Li, S. Shimada, H. Kiyono and A. Hirose, Synthesis of Ti—Al—Si—N nanocomposite films using liquid injection PECVD from alkoxide precursors. Acta Materialia, 2006. 54(8): pages 2041-2048.
[11] S. Abisset, F. Maury, R. Feurer, M. Ducarroir, M. Nadal and M. Andrieux; Gas and plasma nitriding pretreatment of steel substrates before CVD growth of hard refractory coatings; Thin Solid Films, 315 (1998) 179-185.
[12] FR 1562862 filed on Dec. 18, 2015.

What is claimed is:
1. Nuclear component chosen from a nuclear fuel cladding, a spacer grid, a guide tube, a plate fuel or an absorbent rod, comprising:
   i) a support containing a substrate comprising a metallic material and a ceramic material, the substrate being coated or not coated with an interposed layer placed between the substrate and at least one protective layer, the substrate comprising a metal body sandwiched between an outer body made of ceramic-matrix composite material and an inner body made of ceramic-matrix composite material, the outer body and the inner body covering, respectively, the outer surface and the inner surface of the metal body which are, respectively, the surfaces which are facing and opposite to the medium external to the nuclear component;

wherein the interposed layer comprises at least one interposed material chosen from chromium, tantalum, molybdenum, tungsten, niobium, vanadium, alloys thereof, a titanium nitride, a titanium carbonitride, a mixed titanium silicon nitride, a mixed titanium silicon carbide, a mixed titanium silicon carbonitride, a mixed titanium aluminum nitride and mixtures thereof;

ii) said at least one protective layer coating said support and composed of a protective material comprising chromium chosen from a partially metastable chromium comprising a stable chromium crystalline phase comprising chromium of centered cubic crystallographic structure according to the Im-3m space group and a metastable chromium crystalline phase comprising chromium of centered cubic crystallographic structure according to the Pm-3n space group, an amorphous chromium carbide, a chromium alloy, a carbide of a chromium alloy, a chromium nitride, a chromium carbonitride, a mixed chromium silicon carbide, a mixed chromium silicon nitride, a mixed chromium silicon carbonitride and mixtures thereof.

2. Nuclear component according to claim 1, wherein the nuclear component has a tubular geometry and is a nuclear fuel cladding, a guide tube or an absorbent rod.

3. Nuclear component according to claim 1, wherein the metal body has a mean thickness less than the mean thickness of the outer body or less than that of the inner body.

4. Nuclear component according to claim 1, wherein the metal body is composed of a metallic material chosen from niobium, tantalum, tungsten, titanium, or base alloys thereof.

5. Nuclear component according to claim 1, wherein the outer body and the inner body each comprise an identical or different ceramic-matrix composite material, chosen from Cf/C, Cf/SiC or SiCf/SiC.

6. Nuclear component according to claim 1, wherein the interposed layer comprises an outer interposed layer and/or an inner interposed layer covering, respectively, the inner surface of said at least one protective layer and the outer surface of the substrate which is, respectively, the surface of the protective layer which is opposite to the medium that is external to the nuclear component and the surface of the substrate which faces the medium that is external to the nuclear component.

7. Nuclear component according to claim 1, wherein the nuclear component further comprises a liner placed on the inner surface of said support which is the surface of said support which is opposite to the medium that is external to the nuclear component.

8. Nuclear component according to claim 7, wherein the liner comprises an upper liner covering the inner surface of said support and/or a lower liner covering the upper liner.

9. Nuclear component according to claim 1, wherein said at least one protective layer is an outer protective layer which coats the outer surface of said support which is the surface of said support facing the medium that is external to the nuclear component, and/or an inner protective layer which coats the inner surface of said support coated or not coated with the liner.

10. Nuclear component according to claim 7, wherein the material of which the liner is composed comprises a titanium nitride, a titanium carbonitride, a mixed titanium silicon nitride, a mixed titanium silicon carbide, a mixed titanium silicon carbonitride, a mixed titanium aluminum nitride, or mixtures thereof.

11. Nuclear component according to claim 1, wherein the chromium alloy is chosen from a chromium/vanadium alloy, a chromium/niobium alloy, a chromium/vanadium/niobium alloy or a chromium/aluminum alloy or the carbide of the chromium alloy is chosen from a carbide of a chromium/vanadium alloy, a carbide of a chromium/niobium alloy, a carbide of a chromium/vanadium/niobium alloy or a carbide of a chromium/aluminum alloy.

12. Nuclear component according to claim 1, wherein the mixed chromium silicon carbide is of "MAX phase" type.

13. Nuclear component according to claim 12, wherein the mixed chromium silicon carbide of "MAX phase" type is chosen from a mixed carbide of formula Cr2SiC, Cr3SiC2 and Cr5Si3C2, or mixtures thereof.

14. Nuclear component according to claim 1, wherein the protective material is doped with an addition element chosen from yttrium, aluminum, vanadium, niobium, molybdenum, tungsten, or mixtures thereof.

15. Nuclear component according to claim 1, wherein said at least one protective layer has a structure comprising a composition gradient and/or an equiaxed structure.

16. Nuclear component according to claim 1, wherein several protective layers of identical or different composition form, respectively, a homogeneous multilayer protective coating or a heterogeneous multilayer protective coating.

17. Nuclear component according to claim 16, wherein the heterogeneous multilayer protective coating comprises protective layers composed of:
chromium and amorphous chromium carbide, or
chromium and chromium nitride, or amorphous chromium carbide and chromium nitride, or
chromium, amorphous chromium carbide and chromium nitride, or
mixed chromium silicon carbide and chromium, or
mixed chromium silicon carbide and amorphous chromium carbide, or
mixed chromium silicon carbide and chromium nitride, or
mixed chromium silicon nitride and chromium, or
mixed chromium silicon nitride and amorphous chromium carbide, or
mixed chromium silicon nitride and chromium nitride, or
mixed chromium silicon carbide and mixed chromium silicon nitride.

18. Nuclear component according to claim 1, wherein the protective material comprising chromium is chosen from a partially metastable chromium comprising a stable chromium crystalline phase comprising chromium of centered cubic crystallographic structure according to the Im-3m space group and a metastable chromium crystalline phase comprising chromium of centered cubic crystallographic structure according to the Pm-3n space group, a chromium alloy, a carbide of a chromium alloy, a mixed chromium silicon carbide, a mixed chromium silicon nitride, a mixed chromium silicon carbonitride and mixtures thereof.

19. Nuclear component according to claim 1, wherein the protective material comprising chromium is chosen from a chromium alloy, a carbide of a chromium alloy, a mixed chromium silicon carbide, a mixed chromium silicon nitride, a mixed chromium silicon carbonitride and mixtures thereof.

\* \* \* \* \*